United States Patent
Kirkpatrick et al.

(10) Patent No.: US 6,624,915 B1
(45) Date of Patent: Sep. 23, 2003

(54) HOLOGRAPHIC RECORDING AND MICRO/NANOFABRICATION VIA ULTRAFAST HOLOGRAPHIC TWO-PHOTON INDUCED PHOTOPOLYMERIZATION (H-TPIP)

(75) Inventors: Sean M. Kirkpatrick, Washington Township, OH (US); Morley O. Stone, Bellbrook, OH (US); Jeffery W. Baur, Bellbrook, OH (US); Lisa R. Denny, Beavercreek, OH (US); Lalgudi V. Natarajan, Beavercreek, OH (US); Timothy J. Bunning, Beavercreek, OH (US)

(73) Assignee: Science Applications International Corporation, San Diego, CA (US)

( * ) Notice: Subject to any disclaimer, the term of this patent is extended or adjusted under 35 U.S.C. 154(b) by 61 days.

(21) Appl. No.: 09/657,169

(22) Filed: Sep. 7, 2000

Related U.S. Application Data

(60) Provisional application No. 60/189,896, filed on Mar. 16, 2000, provisional application No. 60/198,732, filed on Apr. 21, 2000, provisional application No. 60/206,791, filed on May 24, 2000, and provisional application No. 60/216,691, filed on Jul. 7, 2000.

(51) Int. Cl.$^7$ .............. G03H 1/02; G02F 1/13
(52) U.S. Cl. ............... 359/3; 359/1; 359/900; 349/193; 349/201; 430/1
(58) Field of Search ............ 359/3, 4, 7, 1, 359/900; 365/106, 216; 430/1; 369/103; 349/193, 201

(56) References Cited

U.S. PATENT DOCUMENTS

| | | | |
|---|---|---|---|
| 3,922,061 A | * 11/1975 | Glass et al. .......... 359/7 |
| 4,078,229 A | 3/1978 | Swanson et al. ...... 340/173 |
| 4,093,338 A | 6/1978 | Bjorklund et al. .... 350/3.7 |
| 4,339,513 A | * 7/1982 | Alvarez et al. ....... 430/1 |
| 4,431,259 A | * 2/1984 | Blorklund et al. ..... 430/1 |
| 4,458,345 A | * 7/1984 | Blorklund et al. ..... 359/7 |
| 5,283,777 A | 2/1994 | Tanno et al. ......... 369/108 |
| 5,286,862 A | 2/1994 | Schubert ............. 546/14 |
| 5,289,407 A | 2/1994 | Strickler et al. ...... 365/106 |
| 5,325,324 A | * 6/1994 | Rentzepis et al. ..... 365/127 |
| 5,470,690 A | 11/1995 | Lewis et al. ......... 430/269 |
| 5,496,670 A | * 3/1996 | Hvilsted et al. ....... 430/56 |
| 5,640,256 A | * 6/1997 | De Vre et al. ........ 359/3 |
| 5,659,536 A | 8/1997 | Maillot et al. ........ 369/275.1 |

(List continued on next page.)

FOREIGN PATENT DOCUMENTS

WO  WO 99/54784  10/1999  ......... G03C/5/00

OTHER PUBLICATIONS

A.S. Dvornikov, et al., "Advances in 3D Two–Photon Optical Storage Devices", IEEE 1998 International NonVolatile Memory Technology Conf., Proc. on, pp 68–71, 1998.*

A.S. Dvornikov, et al., "Materials and Systems for Two Photon 3–D ROM Devices", IEEE Trans. on Components, Packaging, and Manufacturing Technology—Part A, vol. 20, No. 2, pp. 203–212, Jun. 1997.*

D.A. Parthenopoulos, et al., "Two–photon volume information storage in doped polymer systems", J. Appl. Phys., 68(11) pp 5814–5818, Dec. 1, 1990.*

(List continued on next page.)

Primary Examiner—John Juba
(74) Attorney, Agent, or Firm—Kilpatrick Stockton LLP

(57) ABSTRACT

A process and photoactive media for holographic recording and micro/nanofabrication of optical and bio-optical structures via the simultaneous absorption of two-photons by the photoactive media to induce a simultaneous photochemical change in regions of constructive interference within a holographic pattern is disclosed. The photochemical process of polymerization resulting from the simultaneous absorption of two-photons may be used for the microfabrication of micro and nanoscaled features, holographic data storage, and the formation of switchable diffraction gratings.

29 Claims, 16 Drawing Sheets

U.S. PATENT DOCUMENTS

| | | | |
|---|---|---|---|
| 5,665,493 A * | 9/1997 | Bai et al. | 430/1 |
| 5,684,612 A * | 11/1997 | Wilde et al. | 359/7 |
| 5,699,175 A * | 12/1997 | Wilde | 359/7 |
| 5,739,929 A | 4/1998 | Macfarlane | 359/3 |
| 5,770,737 A | 6/1998 | Reinhardt et al. | 546/285 |
| 5,859,251 A | 1/1999 | Reinhardt et al. | 546/255 |
| 5,912,257 A | 6/1999 | Prasad et al. | 514/356 |
| 5,942,157 A | 8/1999 | Sutherland et al. | 252/582 |
| 6,046,925 A | 4/2000 | Tsien et al. | 365/111 |
| 6,267,913 B1 * | 7/2001 | Marder et al. | 252/582 |
| 2002/0126333 A1 | 9/2002 | Hosono et al. | 359/35 |

OTHER PUBLICATIONS

Robert J. Collier, et al., OPTICAL HOLOGRAPHY, Chapter 1, § 1.7, "Plane and Volume Hologram–Formation Geometries", pp. 19–22, Academic Press, New York, 1971.*

Pikas et al. "Electronically Switchable Reflection Holograms Formed Using Two–Photon Photopolymerization." Appl. Phys. A 74, Issue 6, pp. 767–772 (2002).

International Search Report dated Apr. 20, 2001.

Preliminary Examination Report for Application No. PCT/US00/24618, dated May 6, 2002 (mailing date).

van Heerden, P. J., "Theory of Optical Information Storage in Solids," *Applied Optics*, vol. 2, No. 4, pp. 393–400, Apr., 1963.

"GeneChip Instrument System" [online], Sep. 5, 1999 retrieved on Jan. 3, 2000, 4 pp., Retrieved from the Internet: http://www.affymetrix.com/products/system.html.

Written Opinion for Application No. PCT/US00/24618, dated Nov. 7, 2001 (date of mailing).

Mansoor Sheik–Bahae, Ali A. Said, Tai–Huei Wei, David J. Hagan and E. W. Van Stryland, *IEEE Journal of Quantum Electronics*, vol. 26, No. 4, Sensitive Measurement of Optical Nonlinearities Using a Single Beam, Apr. 1990.

R. L. Sutherland, L. V. Natarajan, V. P. Tondiglia, T. J. Bunning, *Chem. Mater*, "Bragg Gratings in an Acrylate Polymer Consisting Periodic Polymer–Dispersed Liquid–Crystal Planes", pp. 1533–1538, 1993.

Keiji Tanaka, Kinya Kato, Shinji Tsuru, Shigenobu Sakai, *Journal of the Society for Information Display, Volume,*" Holographically formed liquid–crystal/polymer device for reflective color display", pp. 37–40, 1994.

Guang S. He, Gen C. Xu, Paras N. Prasad, Bruce A. Reinhardt, Jay C. Bhatt, Ann G. Dillard, *Optical Letters*, "Two–photon absorption and optical–limiting properties of novel organic compounds", Optics Letters, vol. 20, No. 5, 1995.

Shoji Maruo, Osamu Nakamura, Satoshi Kawata, *Optics Letters, vol. 22, No. 2,* "Three–dimensional microfabrication with two–photon–absorbed photopolymerization", pp. 132–134, 1997.

L. Domash, Y.–M. Chen, C. Gozewski, P. Haugsjaa, M. Oren, *Proceedings of SPIE, vol. 3010*, "Electronically switchable Bragg gratings for large scale NXN fiber optic crossconnects", pp. 214–228, 1997.

L. V. Natarajan, R. L. Sutherland, V.P. Tondiglia, T. J. Bunning, R. M. Neal, *Proceedings of SPIE, vol. 3143,* "Electrically switchable holograms containing novel PDLC structures", pp. 182–190, 1997.

Bruce A. Reinhardt, Lawrence L. Brott, Stephen J. Clarson, Ramamurthi Kannan, Ann G. Dillard, *Proceedings of SPIE, vol. 3146*, "Optical Power Limiting in Solution Via Two–Photon Absorption: New Aromatic Heterocyclic Dyes with Greatly Improved Performance", pp. 2–11, 1997.

J. E. Ehrlich, X. L. Wu, I.–Y. S. Lee, Z.–Y. Hu, H. Rockel, S. R. Marder, and J. W. Perry, *Optics Letter, vol. 22, No. 24*, "Two–photon absorption and broadband optical limiting with bis–donor stilbenes" pp. 1843–1845, 1997.

L. V. Natarajan, R. L. Sutherland, T. J. Bunning, V. P. Tondiglia, *Proceedings of SPIE, vol. 3292*, "Holographic PDLCs for optical beam modulation, deflection, and dynamic filter applications", pp. 44–51, 1998.

Jeffery W. Baur, Max D. Alexander, Michael Banach, Bruce Reinhardt, Paras N. Prasad, Lixiang Yaun, Richard A. Vaia, *Proceedings of SPIE, vol. 3472*, "Influence of Molecular Environment on Single Photon Behavior of Heterocyclic NLO Chromophores and Its Implications to Two–Photon Behavior", pp. 70–79, 1998.

R. A. Borisov, G.N. Dorojkina, N. I. Koroteev, V. M. Kozenkov, S.A. Magnitskii, D. V. Malakhov, A. V. Tarasishin, A. M. Zheltikov, *Applied Physics B, Lasers and Optics, vol. 67,* "Fabrication of three–dimensional periodic microstructures by means of two–photon polymerization", pp. 765–676, 1998.

Bruce A. Reinhardt, Lawrence L. Bross, Stephen J. Clarson, Ann G. Dillard, Jayprakash C. Bhatt, Ramamurthi Kannan, Lixiang Yuan, Guang S. He, Paras N. Prasad, *Chemistry of Materials*, Highly Active Two–Photon Dyes: Design, Synthesis, and Characterization toward Application, pp. 1863–1874, 1998.

Marius Albota, David Beljonne, Jean–Luc Bredas, Jeffrey E. Ehrlich, Jia–Ying Fu, Ahmed A. Heikal, Samuel E. Hess, Thierry Kogej, Michael D. Levin, Seth R. Marder, Dianne McCord–Maughon, Joseph W. Perry, Harald Rockel, Mariarcristina Rumi, Girija Subramaniam, Watt W. Webb, Xiang–Li Wu, Chris Xu, *Science, vol. 281,* Design of Organic Molecules with Large Two–Photon Absorption Cross Sections, pp. 1653–1656, 1998.

J. Swiatkiewicz, P. N. Prasad, B. A. Reinhardt, *Optics Communications,* "Probing two–photon excitation dynamics using ultrafast laser pulses", pp. 135–138 1998.

Shoji Maruo and Satoshi Kawata, *Journal of Microelectromechanical Systems,* "Two–Photon–Absorbed Near–Infrared Photopolymerization for Three–Dimensional Microfabrication", pp. 411–415, 1998.

Mukesh P. Joshi, J. Swiatkiewicz, Faming, Xu, Paras N. Prasad, *Optics Letters, vol. 23, No. 22,* Energy transfer coupling of two–photon absorption and reverse saturable absorption for enhanced optical power limiting, 1742–1744, 1998.

Jennifer Hicks, *R&D Magazine,* "Genetics and Drug Discovery Dominate Microarray Research", pp. 28–33, 1999.

Sid Marshall, *R&D Magazine,* "Fundamental Changes, Ahead for Lab Instrumentation", pp.18–22, 1999.

Hong–Bo Sun, Shigeki Matsuo, Hiroaki Misawa, *Applied Physics Letters, vol. 74, No. 6,* "Three–dimensional photonic crystal structures achieved with two photon–absorption photopolymerization of resin", pp. 786–788, 1999.

Haridas E. Pudavar, Mukesh P. Joshi, Paras N. Prasad, *Applied Physics Letters, vol. 74, No. 9,* "High–density three–dimensional optical data storage in a stacked compact disk format with two–photon writing and single photon readout", pp. 1338–1340, 1999.

Brian H. Cumpson, Sundaravel P. Ananthavel, Stephen Barlow, Daniel L. Dyer, Jeffrey E. Ehrlich, Lael L. Erskine, Ahmed A. Heikal, Stephen M. Kuebler, I.-Y. Sandy Lee, Dianne McCord–Maughon, Jinqui Qin, Harald Rockel, Mariarcristina Rumi, Xiang–Li Wu, Seth R. Marder, Joseph W. Perry, *Nature,* "Two–photon polymerization initiators for three–dimensional optical data storage and microfabrication", pp. 51–54, 1999.

A. L. Campbell, T. J. Bunning, M. O. Stone, D. Church, and M.S. Grace, *Journal of Structural Biology,* "Surface Ultrastructure of Pit Organ, Spectacle, and Non Pit Organ Epidermis of Infrared Imaging Boid Snakes: A Scanning Probe and Scanning Electron Microscopy Study", pp. 105–120, 1999.

L. V. Natarajan, S. Kirkpatrick, R. L. Sutherland, P. A. Fleitz, T. M. Cooper, L. A. Sowards, C. W. Spangler, B. Reeves, *Proceedings of SPIE, vol. 3798,* "Spectroscopy and nonlinear optical absorption of bis(diphenylamino) diphenyl polyenes", 155–165, 1999.

S. M. Kirkpatrick, J. W. Baur, C. M. Clark, L. R. Denny, D. W. Tomlin, B R. Reinhardt, R. Kannan, M. O. Stone *Applied Physics A,* "Holographic recording using two–photon–induced photopolymerization", 461–464, 1999.

Jeffery W. Baur, Max D. Alexander, Jr. Michael Banach, Lisa R. Denny, Bruce A. Reinhardt, and Richard A. Vaia, *Chemistry of Materials,* Molecular Environment Effects on Two–Photon–Absorbing Heterocyclic Chromophores, 2899–2906, 1999.

M. Campbell, D. N. Sharp, M. T. Harrison, R. G. Denning and A. J. Turberfield, *Nature,* "Fabrication of photonic crystals for the visible spectrum of holographic lithography", 53–56, Mar. 2000.

R. T. Pogue, R. L. Sutherland, M. G. Schmitt, L. V. Natarajan, S. A. Siwecki, V. P. Tondiglia and T. J. Bunning, *Applied Spectroscopy,* "Electrically Switchable Bragg Gratings from Liquid Crystal/Polymer Composites", 12A–28A, Nov. 2000.

Morley O. Stone, J. W. Baur, Laura A. Sowards, Sean M. Kirkpatrick, *Commercial and Biomedical Applications of Ultrafast Lasers II,* "Ultrafast holographic recording of snake infrared pit tissue using two–photon induced photopolymerization", 36–42.

Sean M. Kirkpatrick, Lisa R. Denny, Morley O. Stone, *Diffractive/Holographic Technologies and Spatial Light Modulators VII,* "Ultrafast Holographic Recording Using Two–Photon Induced Photopolymerization", 102–107, 2000.

Chris C. Bowley, Haiji Yuan, Gregory P. Crawford, "Morphology of Holographically–Formed Polymer Dispersed Liquid Crystals (H–PDLC)", *Mol. Cryst. Liq. Cryst.,* 1999, vol. 331., pp. 209–216.

G. P. Crawford, T. G. Fiske, L. D. Silverstein, "Reflective Color LCDs Based on H–PDLC and PSCT Technologies", *SID International Symposium Digest of Applications Papers,* May 14–16, 1996, p. 99.

* cited by examiner

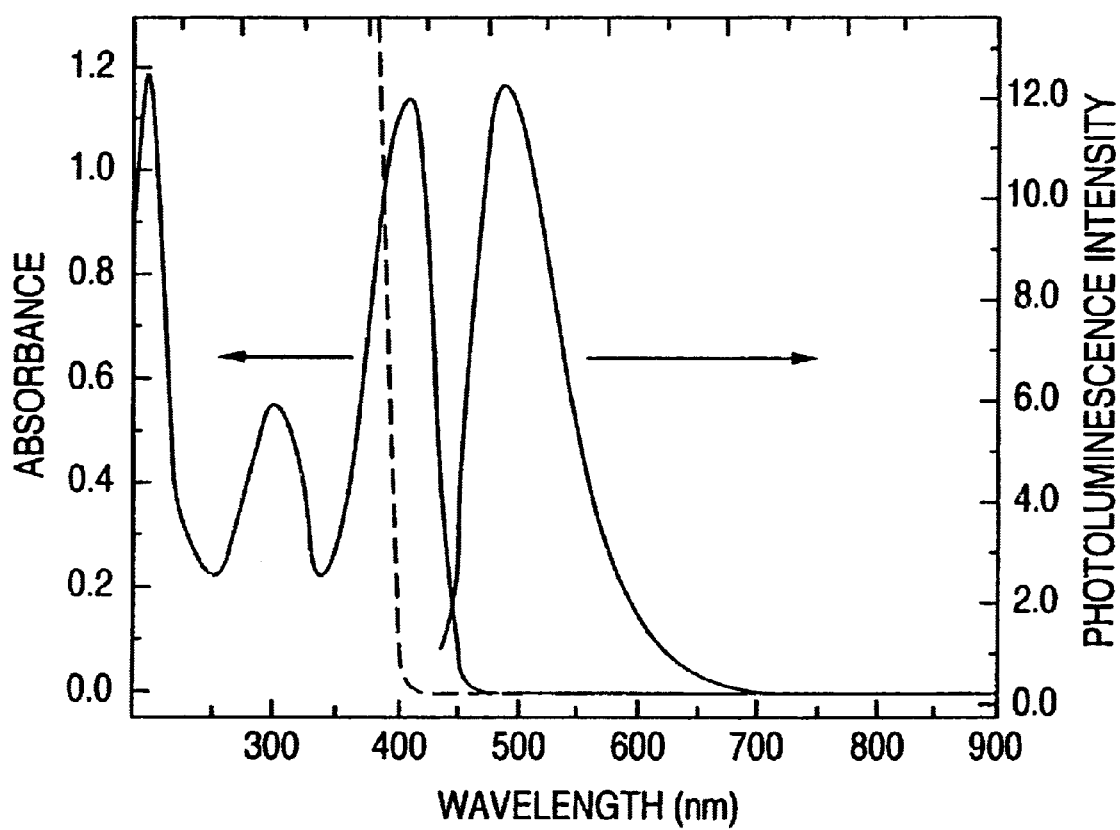

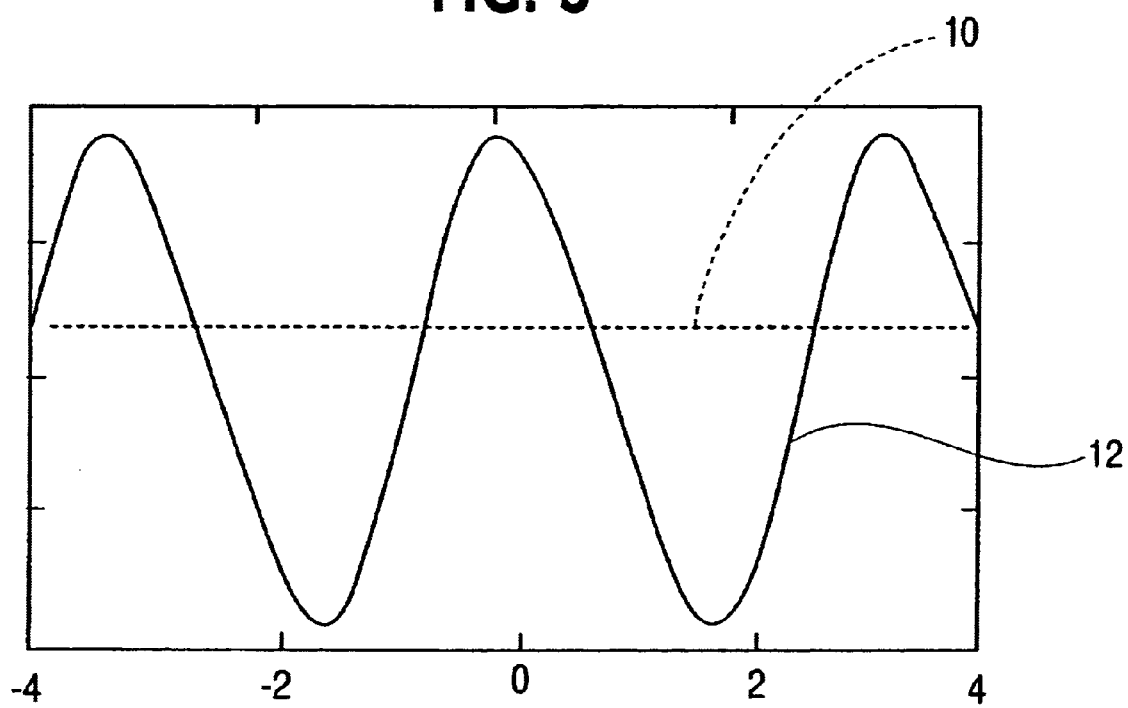

HOLOGRAPHIC RECORDING AND MICRO/NANOFABRICATION VIA ULTRAFAST HOLOGRAPHIC TWO-PHOTON INDUCED PHOTOPOLYMERIZATION (H-TPIP)

CROSS-REFERENCE TO RELATED APPLICATIONS

This application claims priority to the following provisional applications each of which is incorporated herein by reference in its entirety: provisional application No. 60/189,896 filed Mar. 16, 2000; provisional application No. 60/198,732 filed Apr. 21, 2000; provisional application No. 60/206,791 filed May 24, 2000, and provisional application No. 60/216,691 filed Jul. 7, 2000.

The U.S. Government has a paid-up license in this invention and the right in limited circumstances to require the patent owner to license others on reasonable terms as provided for by the terms of contract no. F33615-95-C-5423 awarded by United States Department for the Air Force.

FIELD OF THE INVENTION

The preferred embodiments of the present invention relate to a process of two-photon induced photopolymerization for the formation of microstructures. More particularly, the preferred embodiments of the present invention relate to holographic two-photon induced photopolymerization ("H-TPIP") in the construction of reflection and transmission holograms.

BRIEF SUMMARY OF THE INVENTION

Summary of the Problem

Molecular excitation via the simultaneous absorption of two photons can lead to improved three-dimensional ("3D") control of photochemical or photophysical processes due to the quadratic dependence of the absorption probability on the incident radiation intensity. This has lead to the development of improved 3D fluorescence.

Recently, the ability to fabricate 3D optical storage devices and ornate 3D microstructures has been demonstrated using two-photon induced photopolymerization (TPIP). This method requires sequential scanning of a series of extremely short (100–150 fs), high-peak-power ($\geq 100$'s $\mu$W) laser pulses in a tightly focused single-beam geometry to cross the TPIP initiation threshold.

Others have sought to intersect two or more separate beams within a 3D photoactive material to induce simultaneous two-photon absorption exclusively within their respective intersection volumes. More recently, still others have sought to create three dimensional optical storage devices using a single highly focused beam to induce simultaneous two-photon excitation within one spatial region. Using this technique, arrays of photo-induced structures are then made by serially scanning the focused beam within a three dimensional photoactive material.

The microfabrication of microelectromechanical systems (MEMS) for biotechnology applications (bioMEMS) is a rapidly growing field. High-throughput DNA analysis is of central importance due to the many applications including, for example, chemical/biological weapons (CBW) defense. Bioagent detection, e.g., anthrax spores, can be accomplished quickly and specifically using high-throughput DNA analysis based on standard techniques like polymerase chain reaction (PCR). For industry, high-throughput DNA analysis has implications for the Human Genome Project.

The industrial challenge of completing the Human Genome Project is based on miniaturization technology which allows for more DNA to be analyzed in dramatically shorter time frames (minutes versus hours).

To this end, there is currently a push towards a lab-on-a-chip which makes use of conventional photolithography and laser induced fluorescence imaging to create a microfluidic plate containing site specific functionality. Microfluidic chips have the potential to synthesize thousands of individual molecules in microchannels in minutes, instead of the hours or days traditionally needed. The target species lab-on-a-chip microfluidic experiments are DNA, pathogens, toxins, cell-specific, and protein-specific. Various exemplary applications for utilization of lab-on-a-chip microfluidic experiments are environmental monitoring, biological warfare detection, cell sorting, protein separation, medical diagnostic, filtration, etc. The basic premise is to fabricate microfluidic channels, which have some form of functionality associated with individual pathways or micro-reservoirs. This functionality can take the form of enzymes, antibodies, DNA binding proteins, catalytic agents, etc. The injection of a sample, usually on the order of picoliters, flows through the microfluidic plate, causing reactions in various channels or test sites. The unreacted or unbound material is rinsed away. Computer readout of the various reactions is accomplished by tagging the individual reaction sites with a fluorescence dye. A laser is scanned through the plate and fluorescence imaging is used to map the reacted sites.

The manufacturing of these microfluidic chips relies primarily on conventional photolithography. Functionality is imparted after the fact by infusing the chip with some sort of polymer having the incorporated reactive species within it. Various masks are used to isolate different reactive species to specific areas of the chip. Thus, construction of the chips can take a good deal of time. Also, integration of the microlabs into the outside world is a significant challenge, while laser scanning is fine for laboratory work, portable or smaller versions would require something better. Attempts have been made to fiber couple these systems to a portable computer, but this technique has met with little success. A possible solution to that particular problem is being addressed through the conventional multiphoton laser ablation and micro-machining technologies. Industry leaders such as Clark MXR, SpectraPhysics and university collaborators are using high intensity lasers to ablate a channel and to form a waveguide perpendicular to the channel. While this would allow direct fiber optic coupling to the channel, the process is still a serial process, has low resolution, and does not give the elegant finesse required for more complex multidimensional forms.

The ability to reproduce naturally occurring micro and nano-structures is also highly sought after. One major roadblock to being able to image and reproduce these bio-structures is the fact that many conventional imaging technologies utilize ultra-violet wavelengths. Ultra-violet wavelengths are destructive to biological tissue.

Recent advances in conducting polymers to be used as an inexpensive supplement to conventional semiconductor, metallic, and ceramic components, have outpaced the corresponding fabrication techniques, which still rely upon one-photon polymerization and photolithographic technologies. Consequently, fabrication techniques for electronic circuits which utilize these conducting polymers are struggling to keep up with improvements to the conducting materials.

Also, the demand for low cost, high capacity data storage is increasing in both the military and the commercial sector.

In the commercial sector, demand is primarily driven by the increasing digital format in the expanding computer, entertainment, and medical diagnostic areas. The military demand is primarily dictated by the data storage for hyperspectral data/image gathering and simulations. In short, increased optical data storage capacity and speed will be driven by going into the third dimension and by increasing multiplexing (spatial or frequency).

By taking advantage of all three dimensions instead of a planar storage configuration, data storage capacities of 1–10 terabits/cm$^3$ are theoretically possible in the visible spectrum (P. J. Van Heerden, *Appl. Opt.*, 2, 393–400 (1963)). Viewed mostly as a secondary or tertiary (archival) memory device, optical data storage is characterized by huge amounts of low cost per megabyte storage capacity with moderate access times (longer than 10 ms). Despite the low cost per megabyte capacity, storage could easily represent the single most expensive element in such large-scale operations as super computing. Several technologies have been considered for 3D data storage including layered 3-D optical storage, holographic data storage, persistent spectral hole burning, and near-field optical storage.

Because persistent spectral hole burning requires cryogenic temperatures and near-field optical storage has stringent requirements on the placement of the optical probe, their near-term commercialization is questionable. However, layered 3-D optical storage is a logical extension of current optical disk technology in which the information is simply stacked. The volume resolution (i.e., Mb/cm$^3$) of these techniques is based on the precision of the read/write optics, the wavelength, and the resolution of photoactive media.

Further, the infrastructure of the telecommunication, display, and future computing industries rely heavily on the ability to switch information rapidly and with high contrast between two or more different states. The recent development of switchable diffractive elements using, e.g., polymer-dispersed liquid crystals (PDLC), is of interest in this context. These elements are currently formed using one-photon holographic photopolymerization of a reactive monomer mixed with inert liquid crystal material. The holographic overlap of two coherent beams results in a spatially modulated intensity pattern caused by the constructive and destructive interference of the incoming light. Since the rate of polymerization is related to the local intensity, spatially periodic polymerization occurs and subsequent phase separation results in the formation of planes of small LC domains separated by dense polymer regions.

Advantages of using holography over lithography and other surface-mediated structures include (a) the formation of small periods (<1 micron) with high aspect ratios (>50) (e.g. .Bragg gratings), (b) single-step processing, and (c) writing various complex structures, including reflective gratings. The morphology formed is related to the interference pattern established by the holographic overlap and subsequent polymerization response of the monomer. The balance between the polymerization propagation and phase separation controls the final morphology of the two-phase composite: Methods to skew this balance and thus the final morphology across the Bragg period are currently being investigated.

SUMMARY OF THE SOLUTION

The preferred embodiments of the present invention relate to both a process and photoactive media for holographic recording and micro/nanofabrication of optical and bio-optical structures. In particular, the preferred embodiments are concerned with the simultaneous absorption of two-photons by the photoactive media to induce a photochemical change in regions of constructive interference within a holographic pattern. According to embodiments of the present invention, the photochemical process of polymerization resulting from the simultaneous absorption of two-photons may be used for the microfabrication of micro and nanoscaled features, holographic data storage, and the formation of switchable diffraction gratings.

In contrast to the conventional techniques described above, the preferred embodiments of the present invention offer the ability to initiate arrays of photoactive sites in parallel by interfering two relatively unfocused beams while maintaining the potential increase in spatial resolution that is inherent to this nonlinear process. Because the two-photon process can be initiated with long wavelength radiation that has higher transmission for most materials, it is also possible to write 3D holographic structures in relatively thick photoactive materials.

Two-photon holography in the preferred embodiments involves the interference of two or more coherent beams to create regions of high and low intensity in which the two-photon excitation can be made to occur in the high intensity regions. The excitation by the simultaneous absorption of two-photons has several advantages over one-photon excitation in that the occurrence of absorption varies with the square of the intensity as opposed to linearly as known for one-photon excitation. Therefore, an intensity threshold should be surpassed before the process will occur. This can decrease the excitation volume to a subset of the irradiated area and can offer the potential for an increase in spatial resolution of the product of the excitation. The ability to induce two-photon excitation holographically allows for multiple spatial locations of excitation and the potential for rapid feature formation.

H-TPIP may be used to fabricate structures ranging in complexity from, for example, a spiral to a photonic band-gap. Conventionally, a fixed, confocal beam geometry was used to initiate two-photon polymerization while the sample stage was translated. According to the preferred embodiments of the present invention, by taking a holographic approach, entire areas can be written at once. This is analogous to parallel processing while the previous approaches were serial in nature.

Additionally, in various preferred embodiments, ultrafast holography is used to initiate H-TPIP of a reactive monomer mixed with liquid crystal. This results in a switchable micro or nano-grating structure having multiple applications.

The above and other embodiments, aspects, features and advantages will be further appreciated based upon the following description of the preferred embodiments of the invention.

BRIEF DESCRIPTION OF THE DRAWINGS

In the drawings:

FIG. 1 is a plot of linear absorbance, linear fluorescence, and absorption of a monomer mixture of an exemplary chromophore according to an embodiment of the present invention;

FIG. 3 is a theoretical intensity distribution overlapping an intensity threshold according to an embodiment of the present invention;

DETAILED DESCRIPTION OF THE PREFERRED EMBODIMENTS OF THE INVENTION

Figure 2A:
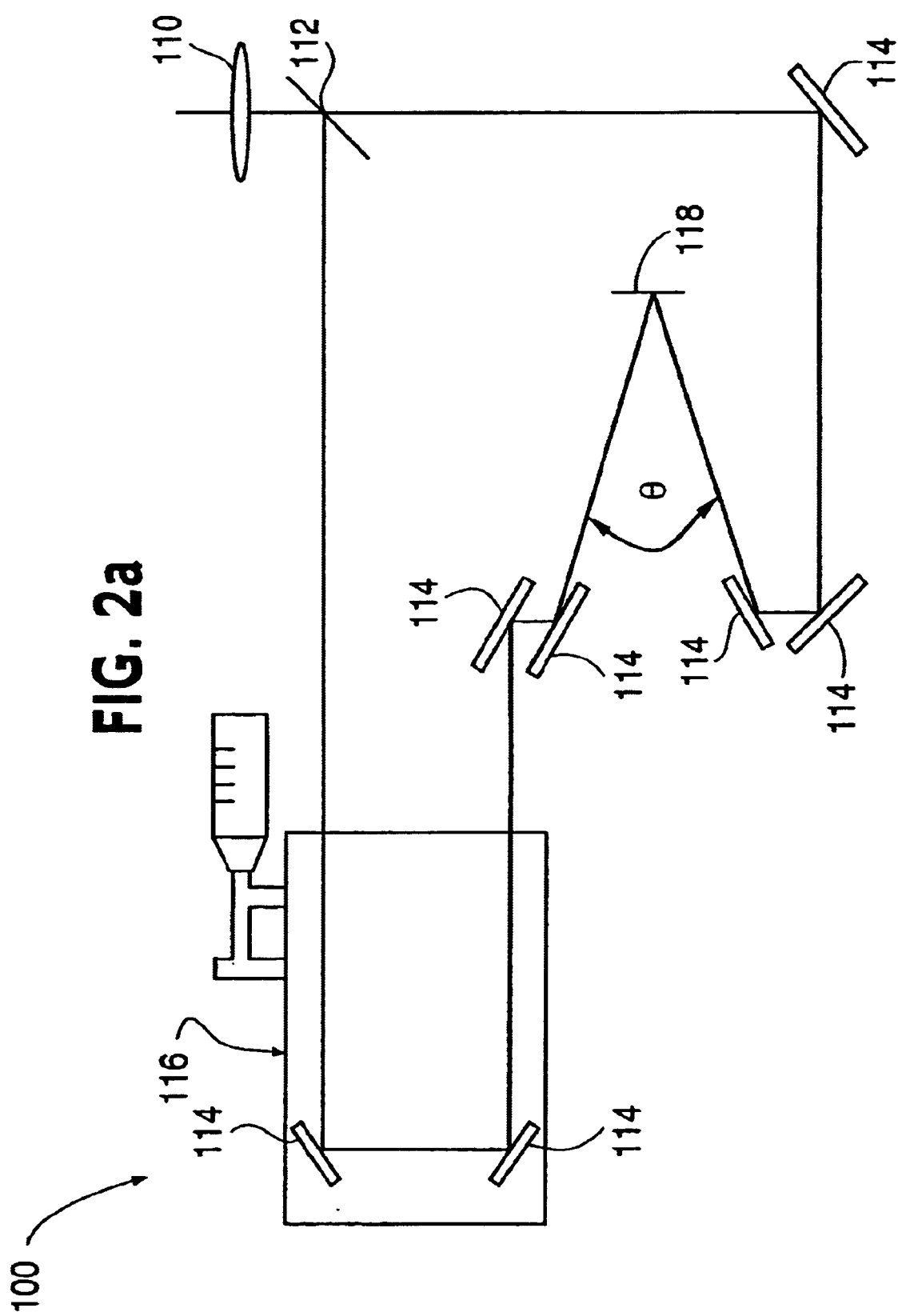
FIGS. 2a and 2b are z-beam transmission and reflection holographic recording set-ups according to embodiments of the present invention.

A process for recording holograms using ultrafast pulsed lasers in conjunction with a two-photon induced photochemical reaction is described below. These photo-induced reactions include, but are not limited to, two-photon induced polymerization or curing, and two-photon induced localized chemical reactions. The basis for these reactions is the simultaneous absorption of two photons from an intense source. Large area patterning is achieved by interfering two or more high intensity pulses to produce an interference pattern which has an intensity distribution falling across the intensity threshold value required for two-photon induced reactions.

In an embodiment of the present invention, a process for forming two- or 3D structures in parallel includes a combination of the constituents of a starting mixture and to a greater extent, the ability to generate complex intensity patterns within a bulk media having little or no linear absorption. Such complex high intensity patterns are achieved by ultrashort (e.g., femtosecond) laser pulses. A two-photon absorbing chromophore is used as the initiation site whereby two photons are simultaneously absorbed provided the photon density is high enough at the site which in this case are the areas of constructive interference. This absorption process effectively up-converts the writing photons to a higher energy. Specifically, the chromophore can then a) radiate a single photon at twice the energy of the writing beam, or b) exchange a virtual photon at twice the energy of the writing beam (energy transfer) with a neighboring molecule not necessarily of the same species. Either event can lead to a localized photochemical reaction provided the reaction is initiated at the energy level of twice the energy of the incident photons. As the two-photon process depends on the square of the intensity distribution, higher resolution patterns are achievable using long wavelength beams, which are not attainable using single photon conventional holographic techniques. In addition, the ability to write patterns in parallel within the bulk can be done using this technique as opposed to linear or serial techniques. Large area patterns on the order of $mm^2$ with resolution in the 10's of nm can be achieved due to the high intensities across a large spot size provided by ultrashort pulses.

Patterning via two-photon holography preferably involves the spatially resolved, photoinduced reaction of a chemical mixture including a combination of the following functional components: a two-photon absorbing chromophore, a reaction initiator, and a reactive matrix. These functional components may each be partitioned into separate chemical species or be combined into one or two multi-functional chemical species. One skilled in the art understands the many configurations possible for implementation of the functional components. For example, in certain embodiments of the present invention, some systems may use the up-converted fluorescence from a two-photon absorption event to excite a separate reaction initiator, while in other embodiments, the systems will directly use the two-photon chromophore as the initiator. Furthermore, a chromophore that is chemically changed through the absorption of two-photons may have all the desired functionality within a single molecule. Regardless of the final number of species blended together, the properties of each functional component involved in two-photon holography play a significant role in achieving the desired pattern.

The efficient absorption of two photons by a chromophore (e.g., Rose Bengal) is important to rapid and facile micropatterning via two-photon holography. The chromophore can be present as either a part of a larger molecule or as a separate blended chemical species. Effective blending to form an optically homogenous resin reaction mixture reduces the optical scattering that may distort the intended pattern. In addition to being easily processed, the chromophores useful in the present invention should preferably be relatively robust and not deleterious to the operation of the final fabricated microstructure. Specific properties of concern include thermal, photo, and chemical stability. A number of molecules with large two-photon absorption cross-sections have been studied and reported in the literature. For some examples of two-photon absorbing chromophores, see U.S. Pat. Nos. 5,859,251 and 5,770,737 to Reinhardt, et al., both of which are incorporated herein by reference in their respective entireties. One of the most well-studied classes of chromophores are conjugated organic molecules having π-electron donors (D) and π-electron acceptors (A) separated by different types of conjugated π-electron bridges (B). The wide-applicability of two-photon holography is demonstrated through the use of chromophores with a variety of donor, acceptor, and bridge types, as well as both symmetric and asymmetric arrangements of these sub-components, to generate photopolymerized microstructures.

Initiators are molecules that produce reaction starting species (e., free radicals, cations, anions) when subjected to an appropriate stimulus (light source, heat, etc.). Initiation of chemistry via two-photon absorption may be incurred directly by chemical reaction of the two-photon absorbing chromophore, by the transfer of the chromophore's excitation energy to a separate initiator, or by both mechanisms. Thus, the more general term "initiator" is used over "photoinitiator" to illustrate that the final reaction initiating species may not necessarily be directly excited by light. An exemplary initiator for use in at least one embodiment of the present invention is Triethanolamine. The efficiency of an initiator is directly proportional to the number of reactive species generated for each two-photon absorption process. Depending on the specific mechanism, this efficiency depends on the configuration or environment of the two-photon absorber or on the efficiency with which the energy can be transferred and used by the separate initiating species. The latter of these mechanisms can, in turn, be dependent on large numbers of factors including spectral properties, concentration, local molecular environment, separation distance, and orientation of both the two-photon absorber and the separate initiator. Various embodiments of the present invention include both systems with no separate initiator and systems that rely upon a separate photoinitiator for efficient reaction.

The reactive matrix (e., polyacrylamide) is broadly defined as the species that undergoes the desired chemical or physical change as a result of the initial two-photon absorption process. These changes can include, but are not limited to, spectral or intensity changes in the fluorescence, index of refraction, molecular conformation changes, molecular weight, and/or the mechanical properties. For example, a monomeric or oligomeric polymer precursor material, can be induced to locally polymerize or cross-link as a result of the two-photon absorption process. Due to the changes in mechanical integrity between the starting material and the reaction product, micro- and even nano-structures can readily be processed in parallel using two-photon holography.

In a specific exemplary embodiment, grating patterns via H-TPIP thin films are fabricated by spin-coating a blend of a two-photon absorbing chromophore comprised of, for example, 0.4% AF380, in an off the shelf monomer (e.g., NOA 72™ which is a commercially available free radical photopolymerizable thiolene optical adhesive which can be cured with light ranging in wavelength from 315 to 450 nm via photoinitiators with peak absorptions at 320, 365, and 420 nm) onto polystyrene and glass slides using a commercially available spincoater (e., Solitec 5110—C/T). AF380 is selected on the basis of its large cross-section ($8 \times 10^{21}$ cm$^4$/GW) and strong upconverted luminescence centered at 500 nm. Referring to FIG. 1, the linear absorbance and photoluminesence of AF380 is illustrated and shows that only the most red-shifted initiator is activated by the upconverted luminescence of the AF380. To ensure solubility and dispersion of the chromophore within the monomer matrix, the chromophore is dissolved in a small amount of either benzene or water prior to blending (the solution depends on the monomer mixture whether or not it was water based). Monomer mixtures are filtered prior to mixing with the chromophore. The final'solution is re-filtered immediately prior to spin coating. In this specific embodiment, films are approximately 10 $\mu$m thick as determined by scanning electron microscopy ("SEM") cross-section. In an alternative embodiment, films are fabricated using various Teflon spacers having a thickness range of 15 microns to 500 microns. These spacers are inserted between two glass plates for fabrication of reflection type holograms.

In further specific embodiments, a special class of material constituents are used for applications in BioMEMS technology. In addition to the functionality described above for general material classes required to produce two-photon holographic patterns, materials for use in BioMEMS have the additional requirement of water solubility. In this way, various components of the mixture can be incorporated into living systems for site specific holographic imaging. By using water-compatible species and naturally occurring constituents, non-toxic "clean" systems can be fabricated. For example, H-TPIP fabrication has been demonstrated in an acrylamide-based, water-compatible system. Acrylamide polymers are routinely used to separate proteins. This system may be polymerized using chemical-based, i.e., ammonium persulfate and TEMED, free-radical polymerization or using light-based free-radical polymerization.

Figure 2B:
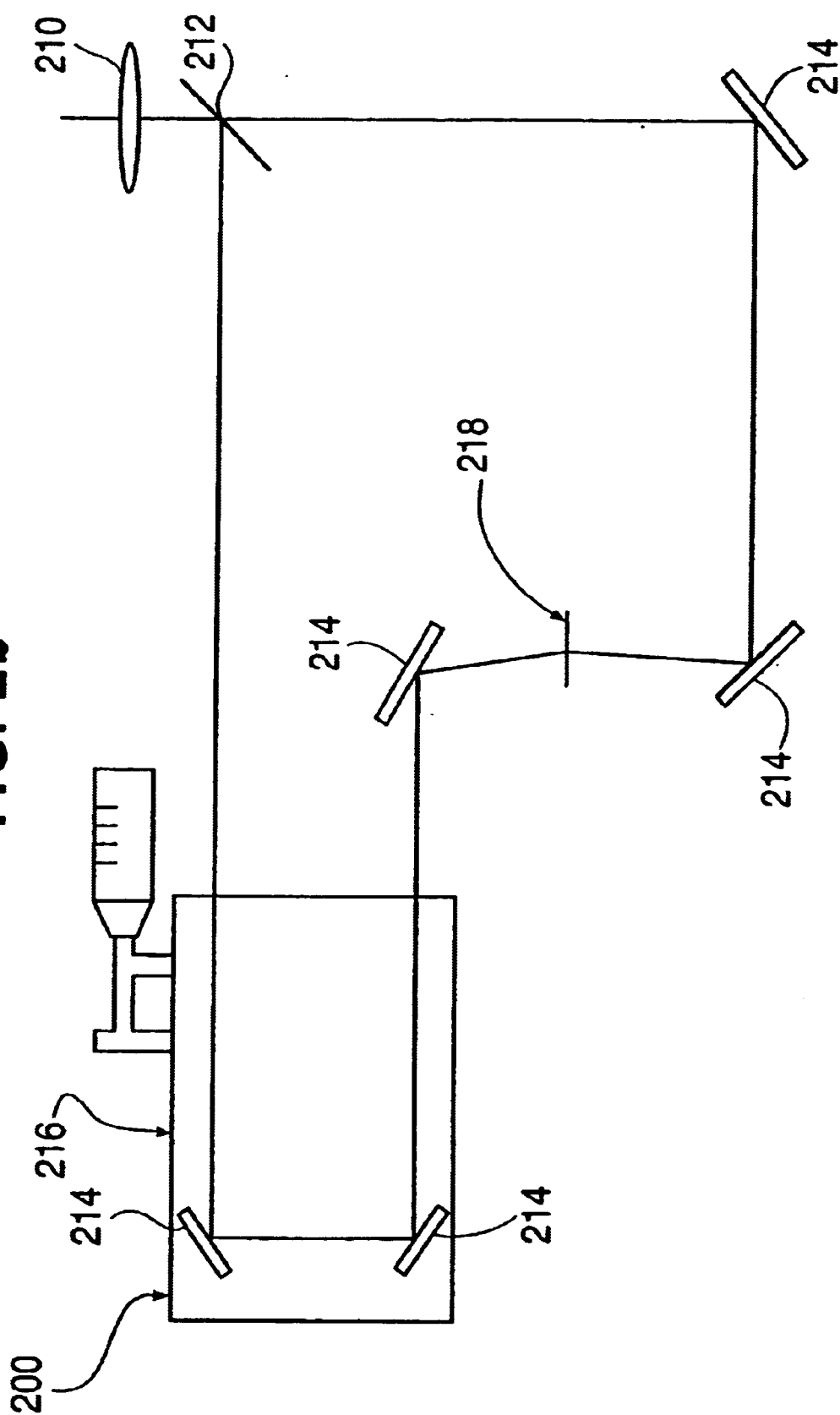

According to an embodiment of the present invention, an optical setup used to write the grating structures is a two beam holographic configuration. Referring to FIG. 2a, for recording a transmission grating, a laser (e.g., Ti:Sapphire femtosecond laser system with regenerative amplification) is used to generate a bandwidth limited ultrafast (typically 90 fs) pulse in the infrared (700–900 nm). High intensity, low dispersion optics are used throughout the experimental set-up 100. The spot size is reduced from a square centimeter to several mm$^2$ using a pair of thin lenses 110 in a telescope arrangement, and the beam is split into two pulses using an ultrafast beam splitter 112 (eg. 70/30 ultrafast beam splitter in a specific embodiment). The resulting relative energies of the two pulses are not equal (e.g., 120 $\mu$J and 150 $\mu$J, respectively in a specific embodiment). The weaker of the two pulses is used for the patterning, while the more energetic pulse provides the threshold value for initiation of the process. This ratio is different per material system. Each of the two beams is propagated along optical delay lines via high intensity, low dispersion mirrors 114. In a preferred embodiment, one of the optical delay lines includes a variable translation stage 116 with a resolution of, for example, 3 fs/step. For transmission type holograms, the two beams are incident on the sample plane 118 (e.g., film or bulk) at an angle of $\phi°$ to the normal, subtending an angle of $2\phi°$ between them. The grating spacing is then defined in the usual manner ($\Lambda=\lambda_o/(2\sin(2\phi))$). For reflection type holograms, the beams are made to counter-propagate as shown in FIG. 2b. As the coherence length of each pulse is approximately 30 $\mu$m, it is important to ensure accurate temporal and spatial overlap.

To ensure temporal overlap, a KDP crystal (not shown) is placed in the sample plane and the translation stage moved until the maximum of the second harmonic generation signal is determined. This process has the advantage of allowing for autocorrelation of the pulse at the sample plane. An alternative embodiment uses a thin film of a two-photon absorbing ("TPA") dye which upconverts the fundamental pulses to a visible wavelength. Zero time overlap is then found by observing the bright flash of nonlinear fluorescence. By maximizing the temporal overlap, the two beams are forced into coherence with respect to each other. In addition, both the KDP crystal, optionally TPA dye and the sample holder are mounted on a rail (not shown) to ensure that the interaction plane is identical by sliding either one or the other into the overlapping beams. The energy of each pulse is attenuated using thin neutral density filters, and is measured at the sample plane using a calibrated power meter. Both the energy and beam size are chosen to give an appropriate intensity distribution about the threshold intensity. Exposure times are determined by the kinetics of the reactions and can vary from as little as tens of seconds to as long as a few minutes. Although the grating spacing is determined from the subtended angle, the actual peak to valley dimension (Z) is determined by the intensity distribution about threshold of the generated pattern. In at least one embodiment of the present invention, peak to valley heights on the order of about 50 nm with large area patterns covering several mm$^2$ are formed.

A threshold intensity exists, above which TPIP can take place. Referring to FIG. 3, dotted line 10 represents an arbitrary intensity threshold while solid line 12 represents an intensity distribution calculated by interfering two 90-fs pulses integrated over the bandwidth. The abscissa is in arbitrary intensity units. A beat pattern is observed oscillating about the peak intensity before the pulse is split in two. In the regions where the intensity is above the threshold, photopolymerization is initiated, whereas in regions below the intensity threshold, there is no initiation.

Figure 4:
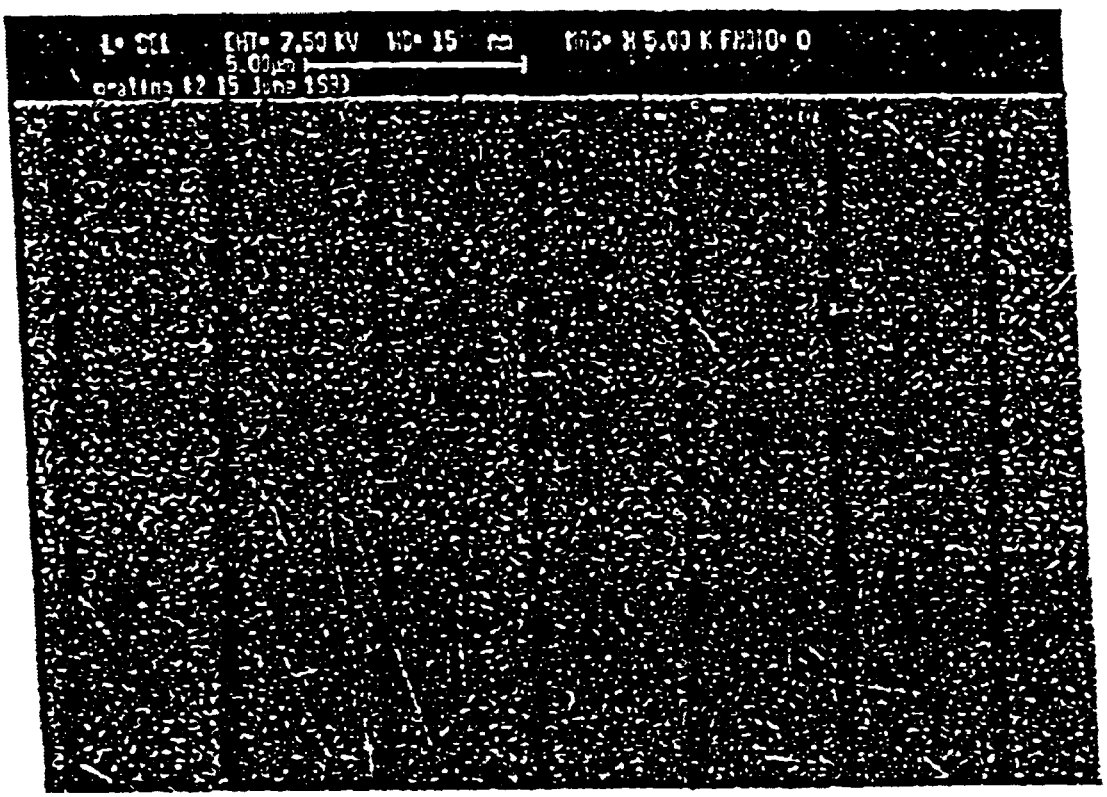
FIG. 4 is a scanning electron microscope ("SEM") image according to an embodiment of the present invention.
Figure 5:
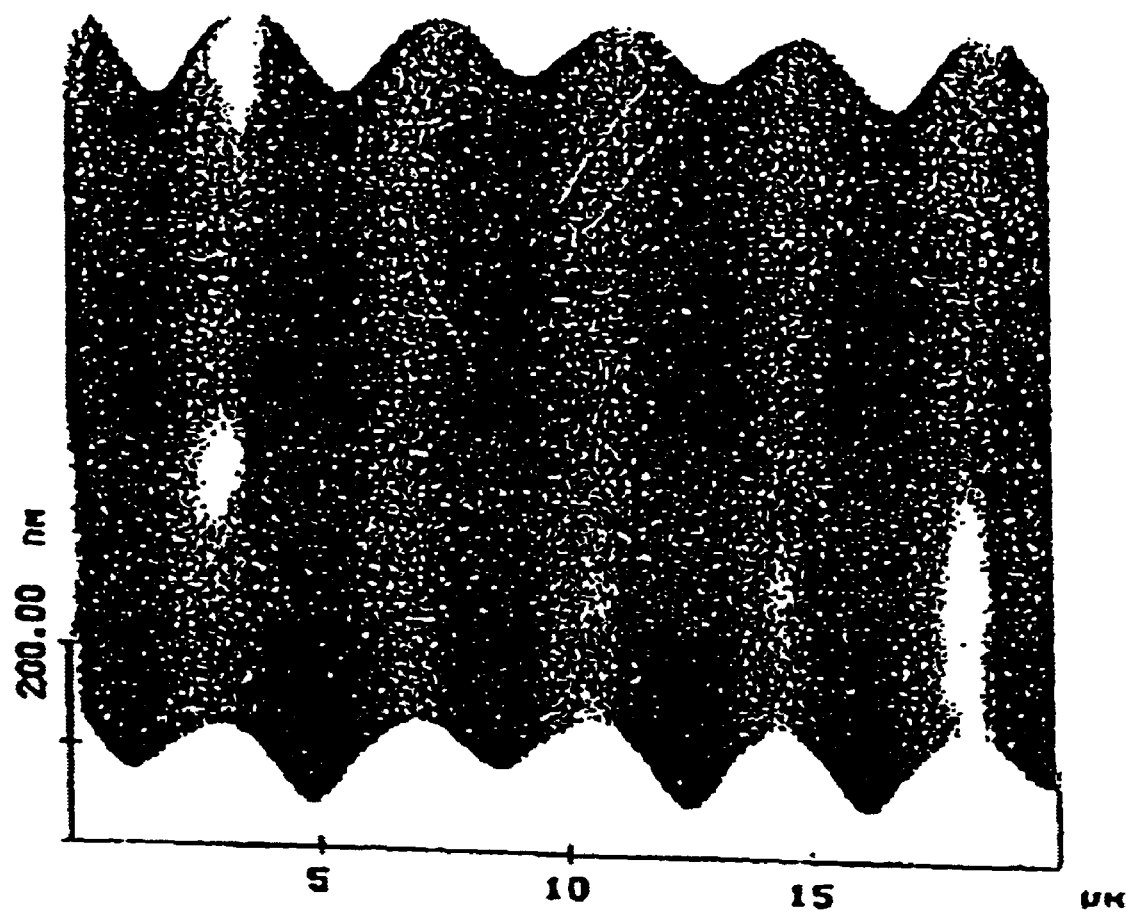
FIG. 5 is an atomic force microscope ("AFM") image according to an embodiment of the present invention.

Further to the specific embodiment of FIG. 3, FIG. 4 is a scanning electron microscope (SEM) image of a grating written under the conditions specified above, utilizing the transmission hologram set-up. The measured spacing from the image is approximately 3 $\mu$m in this embodiment. Similarly, FIG. 5 shows an (AFM) image of the grating region produced under the recordation conditions previously specified. In this specific embodiment, the spacing was measured to be 3.8 $\mu$m with a modulation depth of 50 nm.

In certain embodiments of the present invention, for the formation of grating patterns via H-TPIP within a bulk sample, an infrared cell of various thickness (up to about 1 cm) is filled with a chemical mixture according to the parameters described above. Interference patterns are generated at a depth determined by the geometry of the overlapping beams in relation to the cell thickness. Translation of the cell in the Z-axis direction allows the build-up of multiple patterns in a stacked structure. In an alternative embodiment, interference of three beams could be used to generate a 3-D structure at once. In addition, a third beam also allows for the X and Y structure size to be reduced to the same as the Z dimension. In at least one embodiment of the present invention, transmission grating spacing on the order of 800 nm is achieved.

Figure 6:
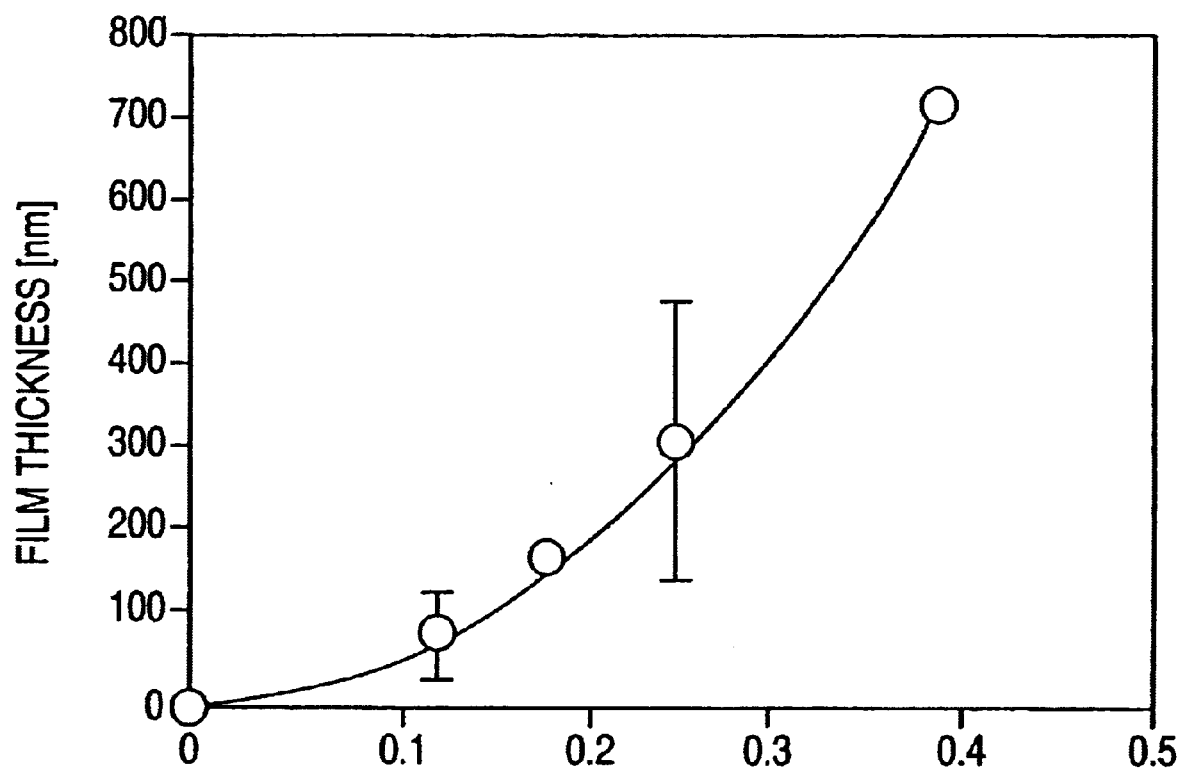
FIG. 6 is a plot of film thickness as a function of pulse energy according to an embodiment of the present invention.

To illustrate that the polymerization is truly a two-photon process, it is possible to measure the film thickness as a function of intensity. FIG. 6 shows a plot of polymer thickness versus pulse energy under identical conditions. As can be seen from the solid line, these data fit to a substantially pure quadratic dependence as expected for such a two-photon assisted process.

Figure 7:
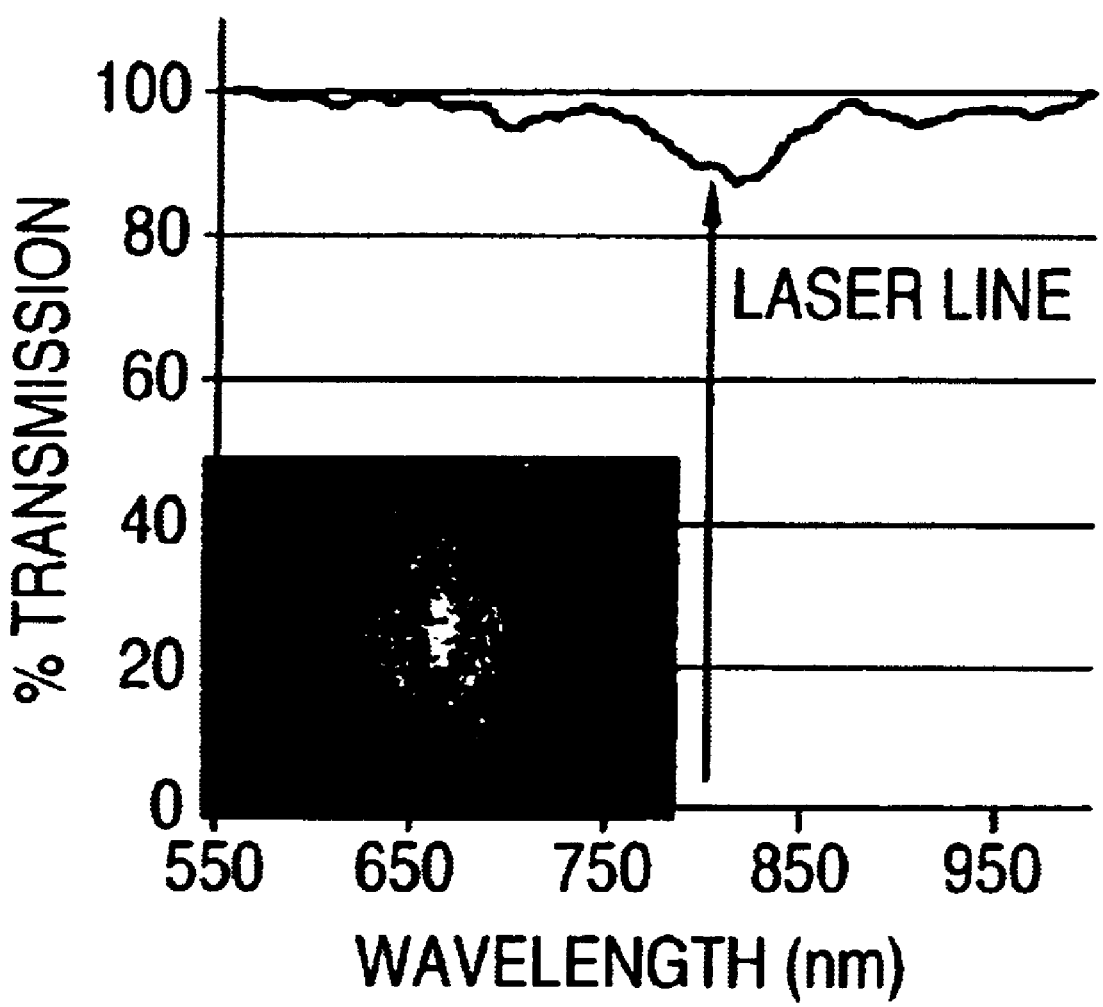
FIG. 7 is a reflection notch and holographic image of a reflection notch grating according to an embodiment of the present invention.

Expanding the transmission holographic technique, preferred embodiments of the present invention contemplate the recordation of holographic reflection gratings using a nearly counter-propagating geometry. The appropriate reflection notch (at the writing wavelength of 800 nm) and a CCD image of the near-normal incidence holographic reflection from a 200 $\mu$m thick film is shown in FIG. 7. In the illustrated embodiment, the total spatial overlap of the counter-propagating pulses is approximately 30 $\mu$m along the propagation axis and the film thickness is approximately 200 $\mu$m. Further, in this particular embodiment, the total area covered by the grating is on the order of 4 mm$^2$, while the diffraction efficiency is approximately 15%.

Figure 8:
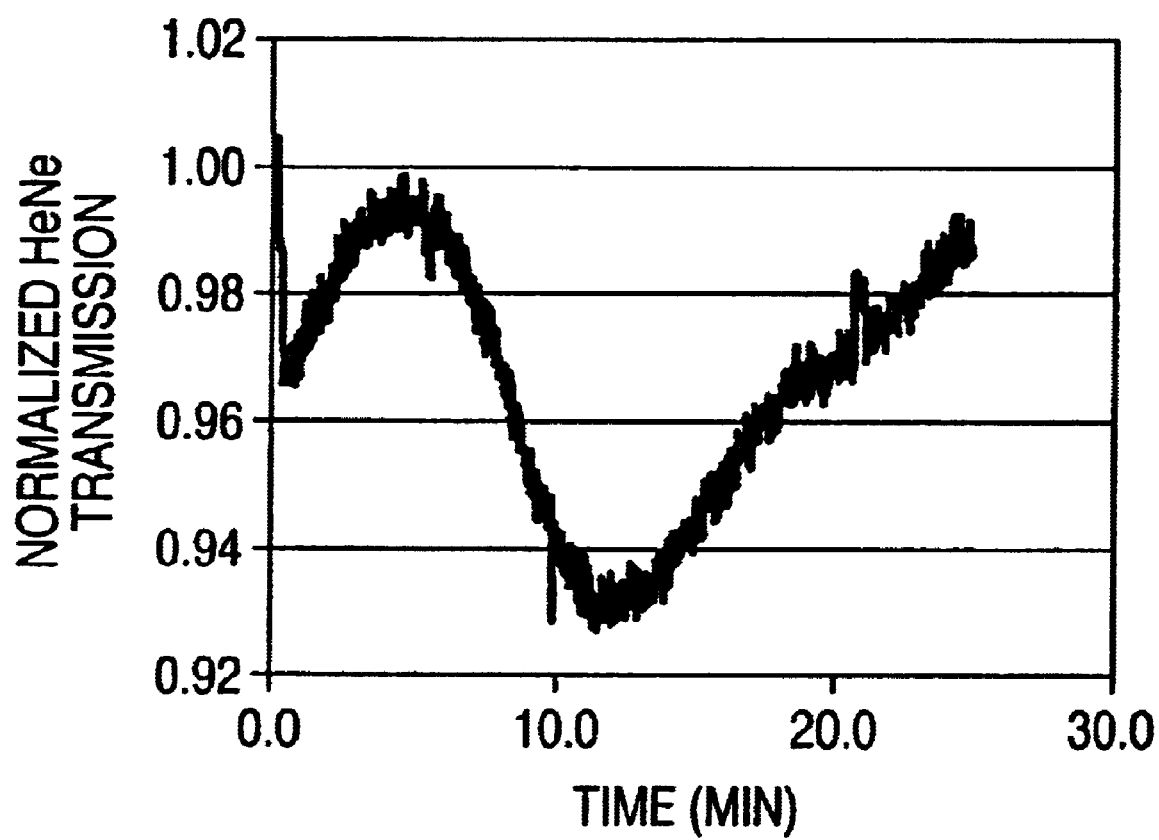
FIG. 8 is a plot of transmission versus time according to an embodiment of the present invention.
Figure 9:
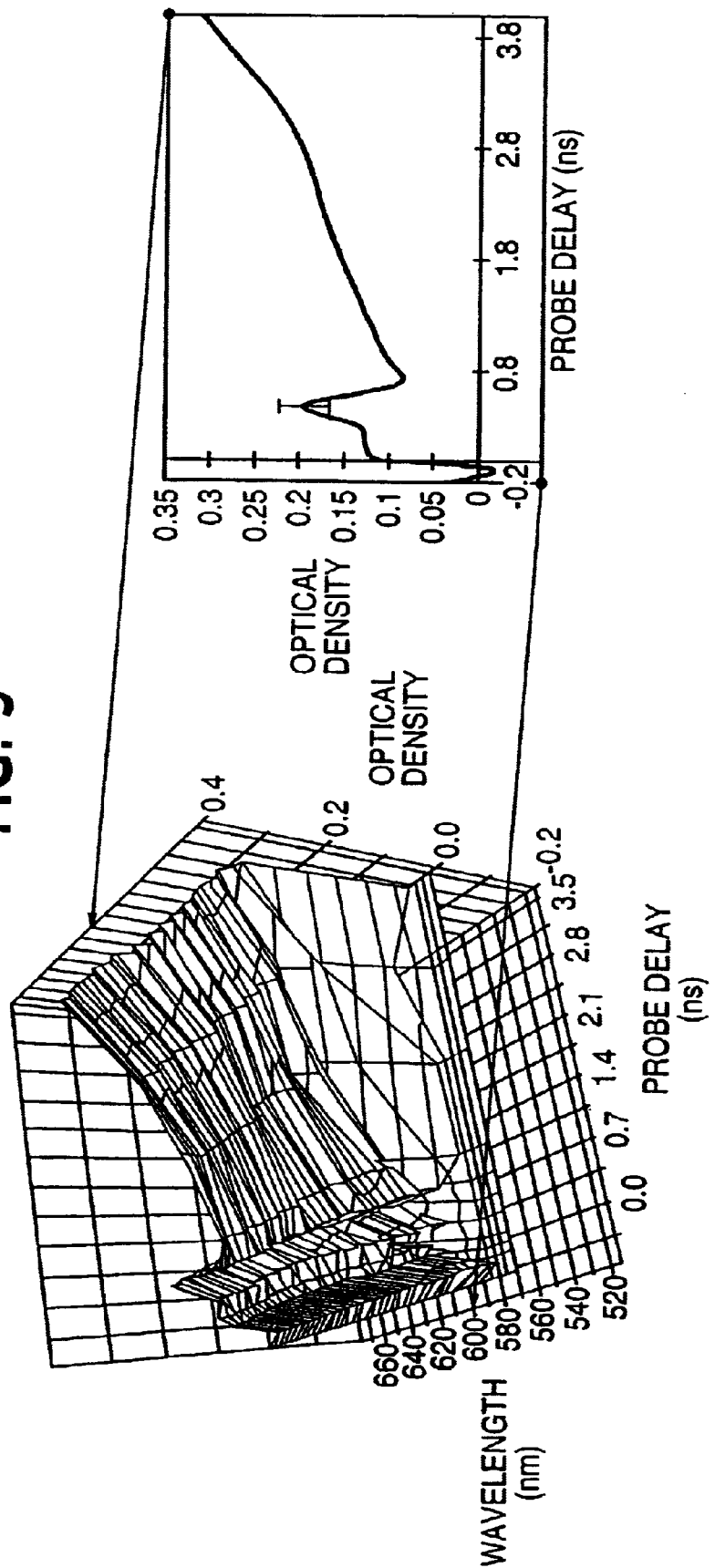
FIG. 9 is a plot of a transient white light absorption spectrum of an exemplary chromophore according to an embodiment of the present invention.
Figure 10:
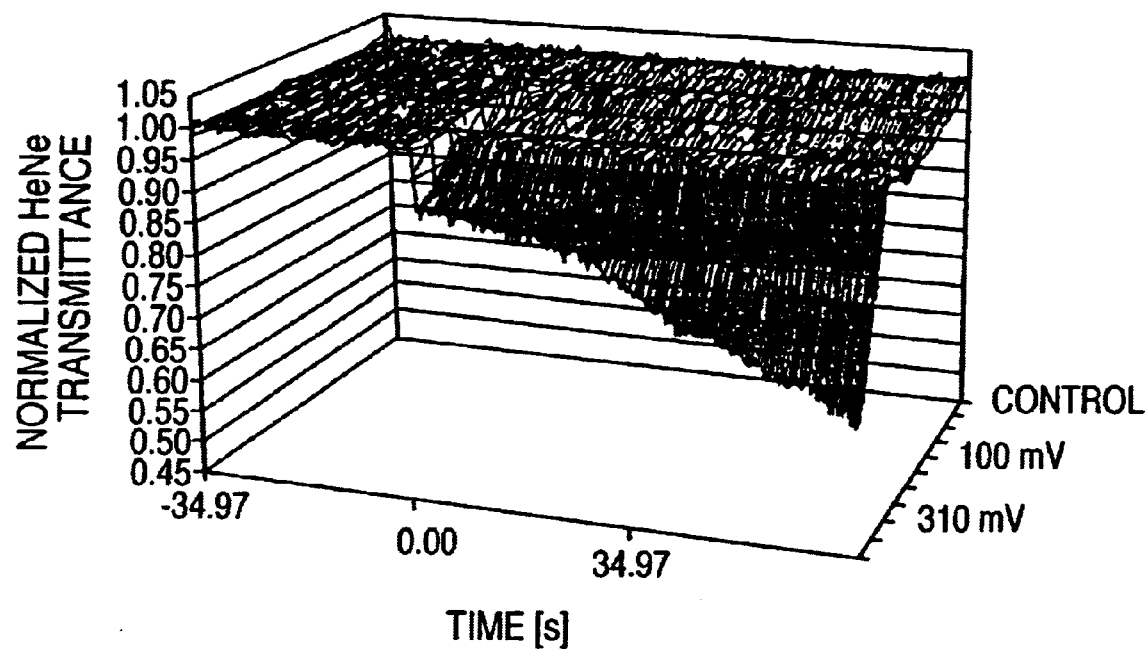
FIG. 10 is a plot of probe beam transmission during a polymer formation process according to an embodiment of the present invention.

In order to tailor the H-TPIP patterning process to specific applications, it is helpful to understand the photophysical mechanisms responsible for the structure formation and then to combine this understanding with careful control over the phase and intensity profile of the short pulsed lasers needed to reach the intensities required. FIGS. 8–10 illustrate the effects of the photophysical processes resulting from the implementation of the two-photon induced polymerization process wherein the monomer used is AF380. FIG. 8 is a temporal measurement of the transmission of a helium-neon laser through the center region of a 10 $\mu$m film during the writing of a grating pattern. The relative mean intensity of the interference pattern is approximately half of what is typically used in order to slow down several of the visible processes. The first feature visible at zero time is an instantaneous drop in the transmission of the HeNe. This is due to excited state absorption (ESA) out of the initial two-photon excited state. The instantaneous drop in transmission associated with the ESA occurs at all pump intensities where two-photon absorption occurs. The time development of the excited state dynamics includes an intermediate state in the dynamics associated with a lower ESA cross section. It has also been found that the longer time scale ESA is associated with absorption to the continuum allowing for nearly free electrons. The transient absorption spectra are shown in FIG. 9. There is a drop in ESA around 500 picoseconds associated with the intermediate transitional state having a lower excited state cross-section. The subsequent slow rise across the entire spectrum is attributed to absorption to a long-lived state; most likely to the continuum population based on energy conservation and molecular quantum calculations of this molecule. The two-photon excited state is the initiating population of the photopolymerization, and any decrease in that population via ESA or quenching leads to an inhibition of the photopolymerization reaction.

Returning to FIG. 8, the gradual increase in the transmission following the initial ESA can be attributed to a thermal relaxation of the viscosity of the film and a slow thinning of the film thickness in response to the thermal load. Laser irradiation at the typical peak intensities results in a column expansion of several percent. For the case of an unconfined film, the thermal expansion will occur in the plane, and thus thins the film. The source of the thermal load comes from the nonradiative relaxation of the two-photon excited state to the nearby one-photon excited state, as well as intramolecular relaxation within the singlet manifold. Due to the close coupling of the one- and two-photon excited states, the total phonon emission is low, as is indicated by the low temperature increase measured in the film.

The large decrease in transmission in the above-described embodiment marks the beginning formation of oligomers and the subsequent cross-linking to form a polymer. Visual inspection of the film during this time reveals a welling up of the material forming a lens type structure, indicating mass transport. The slow increase in the transmission at long times is associated with the process running out of material and slowly relaxing into a polymer film of uniform thickness, with the possibility of evolving excited state dynamics playing a significant role. As the pulse energies are increased (and the corresponding intensities increased), the dip in transmission corresponding to polymer formation moves to the left in time, and eventually occurs nearly instantaneously (see FIG. 10). At these intensities, the polymer formation occurs much faster than the thermal relaxation, making structure formation effectively thermally isolated as the exposure time can be reduced to essentially a few seconds or less. The thermal initiation of the polymerization reaction fully occurs near 200° C. without any observed mass transport, and the laser induces a temperature increase of 10° C. above room temperature.

In a first specific application of the above-described technology, unique and highly efficient micro/nano-sensors are formed. In particular, this process allows for the imaging of naturally occurring micro/nano-sensors. For example, the technology described herein may be used to image, holographically, a unique surface morphology structure present in the infrared pit organs of various snakes. Snakes utilize this pit organ for infrared and thermal detection by allowing for the scattering of unwanted wavelengths of light, while simultaneously transmitting the desired wavelengths. Duplication of this highly advanced morphology, could result in, for example, improved optical coatings and sensors.

The surface morphology of certain snake pit tissue (e.g., Crotalidae and Boidae families) is unique in that the distance between scale junctions is 3.5 mm and the scales are covered with micropits that also have unique dimensions. The scales at the junction points have greatly reduced, almost smooth, ridges compared to pronounced, finger-like projections elsewhere on the snakes body. Experiments examining the optical properties of this tissue indicated that it scattered visible light much more readily than other tissues. In order to duplicate these unique structures, it is helpful to utilize a process that does not result in the absorption of ultra-violet (UV) radiation, since biological structures absorb UV radiation, resulting in damage thereto. The two-photon technology described herein is a natural complement to biological surfaces and matrices because of the greatly reduced intrinsic absorption of biological samples at these longer wavelengths.

Figure 11:
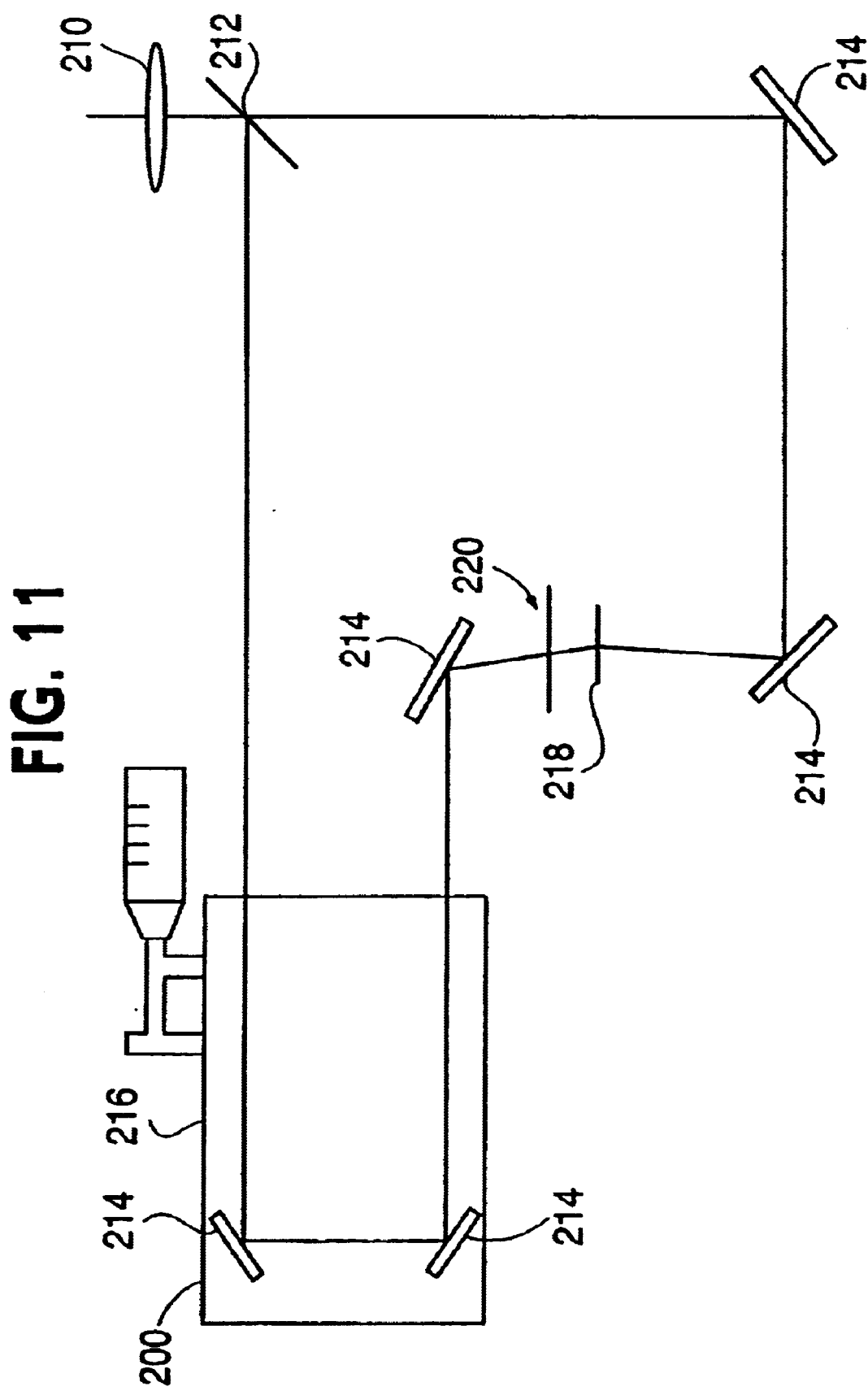
FIG. 11 is an optical set-up for holographically recording an image of a biological sample according to an embodiment of the present invention.

The following set-up and procedure are embodiments of the present invention that may be used to holographically record an image of a biological sample having a unique surface morphology FIG. 11. In a recording set-up virtually identical to FIG. 2(b), a biological sample is mounted on a microscope slide 220. A Fresnel counter-propagating holographic setup, including elements 210 through 216, is used to record information from the biological sample into polymer samples 218 of varying thickness. In this particular reflection hologram setup, the image is written in planes that lie parallel to the polymer sample. The reflected image is the result of varying indexes of refraction created with these polymer planes. Regions of high sample transmission correspond to regions of high physical and holographic structure. Conversely, low sample transmission correspond to regions of low structure.

In this particular embodiment, the holographic setup and the use of a 100 fs pulse length, results in making film thickness an extremely important experimental parameter. As the coherence length of a 100 fs pulse is approximately 30 μm, the proper choice of film thickness becomes critical with respect to the amount of 3-D information stored. Too thin a film will truncate 3D information, while a film that is too thick results in a hologram at depth (or in bulk). Given the above-identified parameters, an approximately 25 μm film gives an appropriate structure and level of detail. One skilled in the art recognizes the many variations possible due to the degrees of freedom inherent to the practice of holography.

In certain embodiments of the present invention, for imaging purposes, a CCD (charge coupled device) camera is used to capture the reflected holographic image produced by illuminating the polymer film with a fiber optic white-light source. This CCD camera captures regions of varying diffraction efficiency. After recording the sample described above, at near-normal incidence the reflection hologram is clearly visible. At approximately 3° rotation, the holographic image disappears. Additional measurements showed a reflection notch at the writing wavelength of 800 nm. The polymer films may also be examined for diagnostic purposes using visible light microscopy. When examined using a long-pass filter (deep red transmission only), the polymer films of the above-described sample set-up and process, show substructure with features $\leq 2.5$ μm.

In an alternative reflection recording set-up, rather than passing 800 nm light through the sample, the initial beam is reflected off of a silver-coated skin sample. This reduces distortion caused by sample transmission.

In a second specific application of the H-TPIP technology to the field of biomimetics, H-TPIP is used to holographically fabricate complex microfluidic chip structures such that functionality is incorporated directly into the structures in a single step. Multiple reactive species are incorporated into the structures by tagging the reactive component with a different two-photon absorbing chromophore. In this manner, structures are formed with varied functionality by applying H-TPIP at a different wavelength. Additionally, multidimensional fabrication is accomplished within the bulk structures allowing for reaction specific pathways in a third direction. Alternatively, nonlinear fluorescence tags are used in place of linear fluorescence tags when looking at the readout of 3D chips. Using the described H-TPIP process, waveguides may be written holographically in parallel and electrical addressing can be incorporated as discussed in, the embodiment below. While the structure described above would most likely require multiple steps in fabrication (possibly a rinse between functional groups), it removes the need for masking, and scanning as each step will be written holographically. Additionally, this H-TPIP process provides the ability to increase the channel, reservoir, or test site density using the nanofabrication capability. The H-TPIP techniques described herein as applied to biomimetic applications and specifically, microfluidics may be used to form for example, the structures described in the articles entitled "Genetics and Drug Discovery Dominate Microarray Research" and "Fundamental Changes Ahead for Lab Instrumentation" both found in *R&D Magazine*, February 1999 and both incorporated herein by reference.

In a third specific application of the present invention, by coupling conducting polymers to a two-photon initiated polymerization reaction, fabrication of microelectronic circuits may be achieved using the H-TPIP technique. Using this technique, one can holographically pattern a 2D or 3D circuit and then rinse away the unpolymerized regions. This technique offers substantial improvements over photolithographic methods including the abolished necessity for masks and the instantaneous and efficient formation of bulk 3D patterns. Again, the parallel processing capability of H-TPIP would also eliminate serial writing of a circuit. A technological advantage, apart from the parallel processing, is the feature size. Electronic circuits can be fabricated on a nanoscale.

In a fourth specific embodiment where the H-TPIP initiates an instantaneous region of polymer surrounding the chromophore, it is possible to trap dopant materials in the polymer matrix by virtue of the cross-link density of the polymer. This cross-link density and polymerization rate is intensity dependent, as well as energy dependent. It is thus possible to nearly instantaneously trap a foreign dopant material in the matrix without the need to have a secure binding site. If the dopant is larger than the interstitial spaces after the final cross-link density is established, then there is little room for migration. By incorporating nano- and microparticles of semiconductors within the polymer matrix, additional conductivity and electrical functionality can be imparted to the structure written via H-TPIP. Attaching nanoparticles to the TPA chromophore adds flexibility to the structure by tagging specific materials with different TPA dyes and allowing fabrication via multiple wavelengths. For example, $C_{60}$ may be attached to one of the TPA dyes.

A fifth specific application of the H-TPIP method and resulting structures is to medical applications. Taking into account the possibility of dopant trapping within the polymer matrix, as described above, it is possible to control the diffusion time of the dopant via the cross-link density arising from the intensity dependent hologram. Subsequently, it is possible to encapsulate pharmaceuticals for time release within a polymer form. Such a form could be implanted under the skin to slowly release a drug, such as insulin, into the body. In an embodiment of the present invention, it is possible to inject a mixture under the skin, and orthoscopically radiate at a two-photon wavelength since this is in the infrared, thus avoiding the radiation hazard. Subsequently, the time-release polymer-drug can be fabricated in real time under the skin.

In a sixth specific application of the present invention an advanced storage memory is constructed using the H-TPIP process. Unlike bit storage memories that rely upon the shrinking of data bits for increased capacity, holographic technologies can record data as an interference pattern with a large spatial extent. One advantage of this approach is that the loss of resolution in one sector of the hologram from a smudge or scratch only decreases the signal to noise ratio and does not cause the total loss of that data bit. Moreover, by varying the incident wavelength and writing angle, many holograms can be multiplexed into a single 3D solid. With the proper optical conditions, the read-out of such a storage device is also very rapid. The magnitude and resolution of the photo-induced index of refraction change will dictate the ultimate storage capacity of such a device.

Through comparison with holographic and two-photon based data storage technologies, it is illustrated that two-photon based holography offers great advantages for 3D optical data storage. For bit-based data storage similar to that used in previously mentioned serial two-photon techniques, two-photon holography allows one to create arrays of patterns in parallel and facilitates faster writing times. Due to the quadratic dependence, on the intensity, two-photon holography also offers the potential to initiate photochemistry with higher spatial resolution than linear holography. This leads to finer spatial control of index of refraction and, ultimately, to more storage capacity. Furthermore, because the photoactive materials are typically much more transmissive at the longer wavelengths used in the two-photon process, deeper penetration will also be possible with this nonlinear holography. When coupled to the pulsed nature of the incident radiation, this offers other opportunities to spatially address holograms within a large 3D solid.

In a seventh specific embodiment of the present invention, periodic gratings are formed using ultrafast holography to initiate two-photon induced photopolymerization (H-TPIP) of a reactive monomer mixed with liquid crystal (hereafter "polymer/LC mixture"). The spatially periodic intensity pattern results in localized differences in the rate of polymerization and subsequent phase separation of the liquid crystal from the polymer host. Depending on the polymer/LC mixture, the resulting nanoscale periodic structure, a confined lamellae (1 μm) of polymer-dispersed liquid crystal droplets (50–200 nm) separated by parallel sheets of polymer (1–1.5 μm), exhibits a periodic refractive index modulation that gives rise to diffraction of light. Modulation of the diffracted intensity profile is achieved by applying an electric field across the holographic grating. The morphology formed using H-TPIP is better defined than gratings formed using conventional holographic techniques at similar grating periods. The fraction of the grating period covered by LC droplets is smaller eg., approximately 30% versus 60–70%) for structures written using two-photon induced phase separation versus conventional one-photon holography.

The particular polymer/LC material used in this embodiment includes a two-photon absorber. By way of example, the two-photon absorber is selected from the bis (diphenylamino) stilbene family as they have been shown to be efficient two-photon polymerization initiators for three dimensional optical data storage and fabrication. Bis (diphenylamino) diphenyl hexatriene, I, has a two-photon absorption cross-section of $1.55 \times 10^{-20}$ GW/cm$^4$ as measured by Z-scan analysis. The polymer/LC material for this particular embodiment includes 0.5% of this amine, a highly functional free-radical polymerizable monomer dipentaerythritol pentaacrylate (DPHPA) 57%, a reactive dilutent N-vinyl pyrrolidinone (NVP) 10%, and nematic liquid crystal E7 32%. No coinitiator is used in this example. The materials and percentages used in this particular embodiment are but one example of a polymer/LC material that may be used in facilitating the current invention. One skilled in the art is referred to U.S. Pat. No. 5,942,157 entitled "Switchable Volume Hologram Materials and Devices" to Sutherland et al., incorporated herein by reference in its entirety, for other examples of suitable polymer/LC material configurations. The polymer/LC is homogenized using, for example, sonication, and is sandwiched between ITO coated glass slides separated by 8 μm diameter glass rod spacers. The cell is sealed on all the sides with epoxy glue.

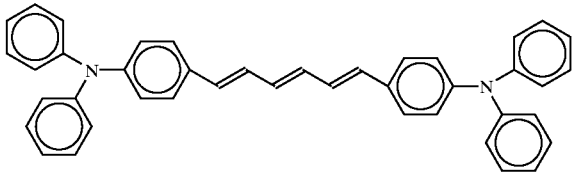

I

Figure 12:
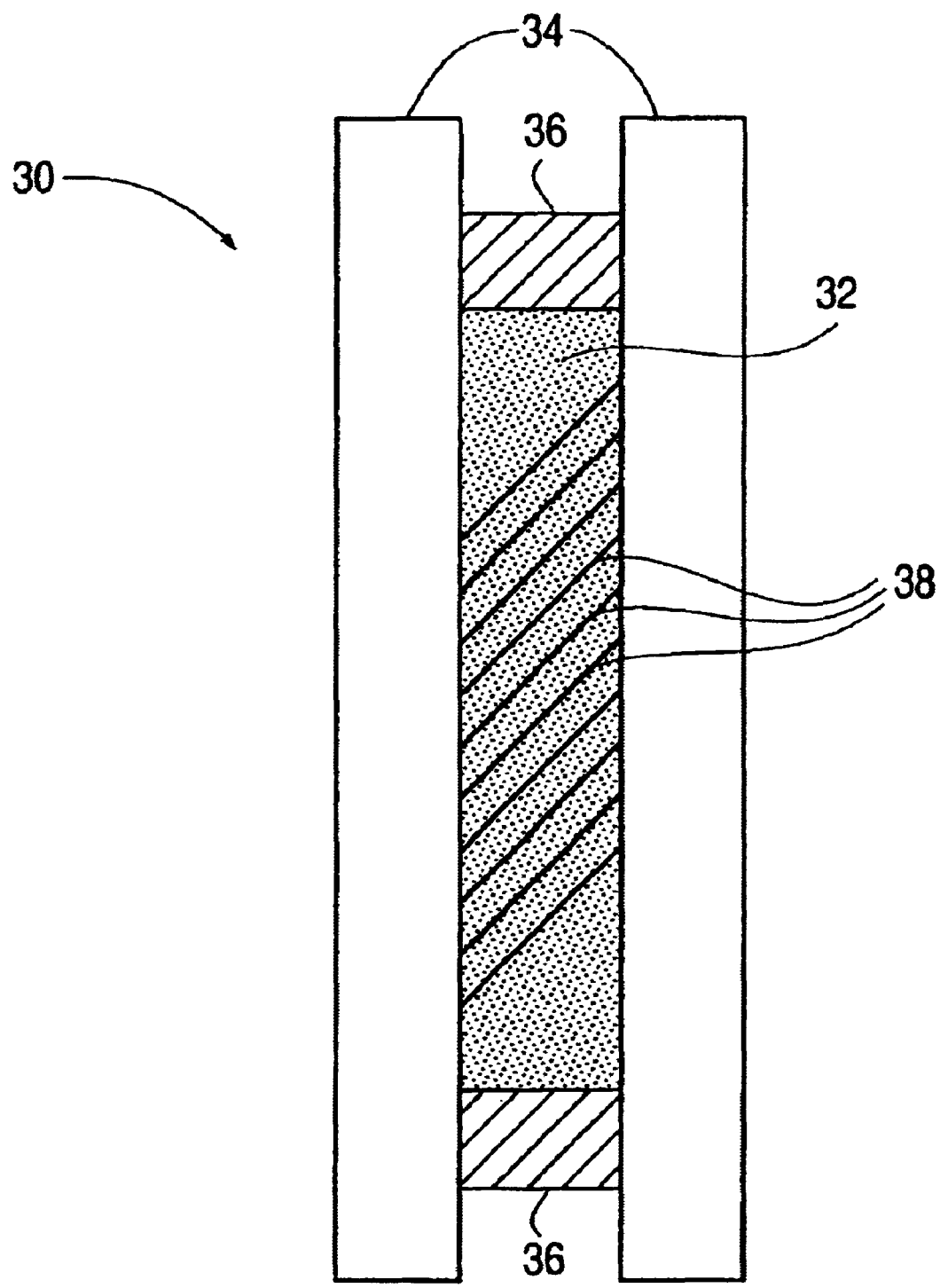
FIG. 12 is a schematic of an exposed blank according to an embodiment of the present invention.

Referring to FIG. 12, in a preferred embodiment, a blank 30 including the polymer/LC material 32, sandwiched between two substrates 34 and spacers 36 is exposed in one of the optical set-ups of FIG. 2(a) and 2(b) for approximately 60 seconds resulting in a grating formation 38. Blank 30 would be placed in the sample plane, 118 or 218, respectively. Electron microscopy may be performed on a low voltage scanning electron microscope (LVSEM) to determine the resulting grating spacing. Optical microscopy may also be performed using, for example, a Nikon Optiphot microscope in order to ascertain the characteristics of the grating structure formed using H-TPIP. Upon application of an electric field (e.g., amplified 2 kHz square wave) the diffracted energy of the illuminating beam may be modulated.

Figure 13A:
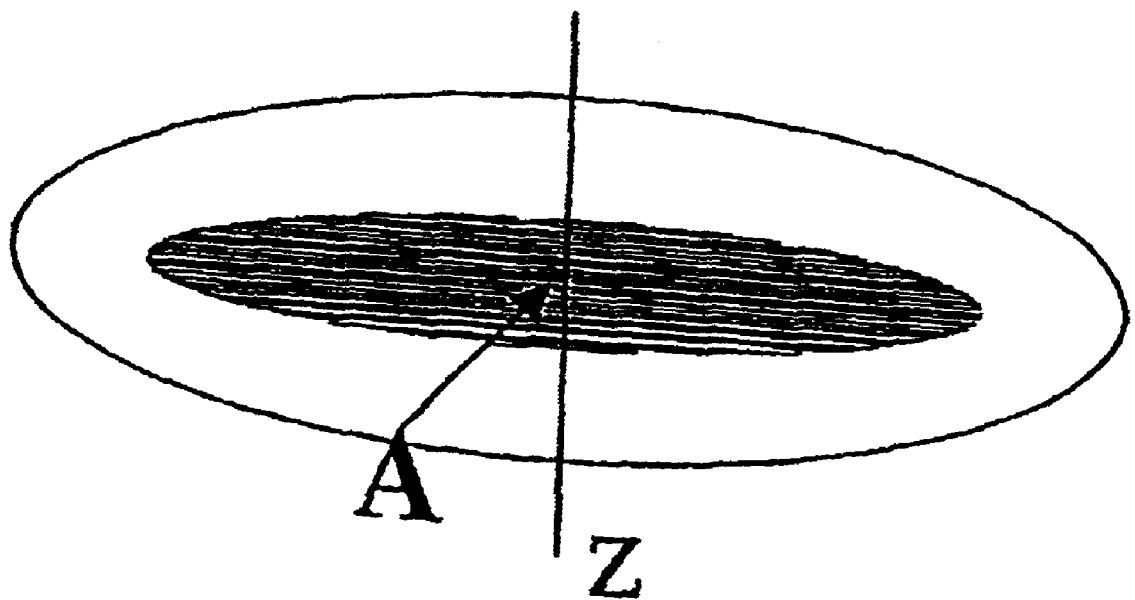
FIGS. 13(a) and 13(b) are grating views within an exposed PDLC blank formed according to, an embodiment of the present invention.
Figure 13B:
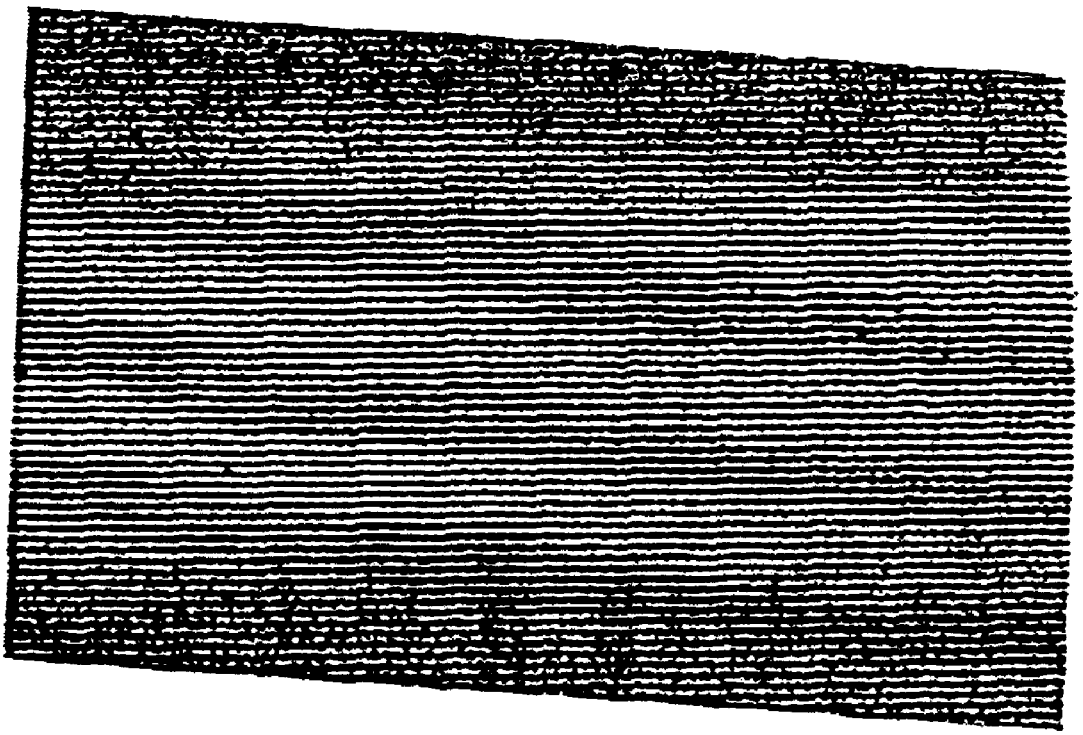

Upon illumination of the grating structure, a small iridescent region in the form of a narrow line may be observed between the substrates. This iridescence is characteristic of a transmission grating and corresponds to diffraction from planes of different refractive indices. Due to the complexity of the optical set-up and the coherence length of the 90 fs pulse, the resulting overlapped area resembles a cat's eye as shown in FIG. 13a. Within the most efficient overlap of the two beams (A), sharp gratings are observed with phase contrast microscopy FIG. 13b.

Polymerization of the acrylate monomer occurs in the entire overlap region as indicated by solidification of the polymer/LC material. Polymerization proceeds by free-radical initiation by anion radicals which is formed due to electron transfer from the excited amine following the two-photon absorption. An advantage of this particular embodiment using the aforementioned polymer/LC material is the absence of a coinitiator needed to act as an electron acceptor to produce a free radical.

Figure 14:
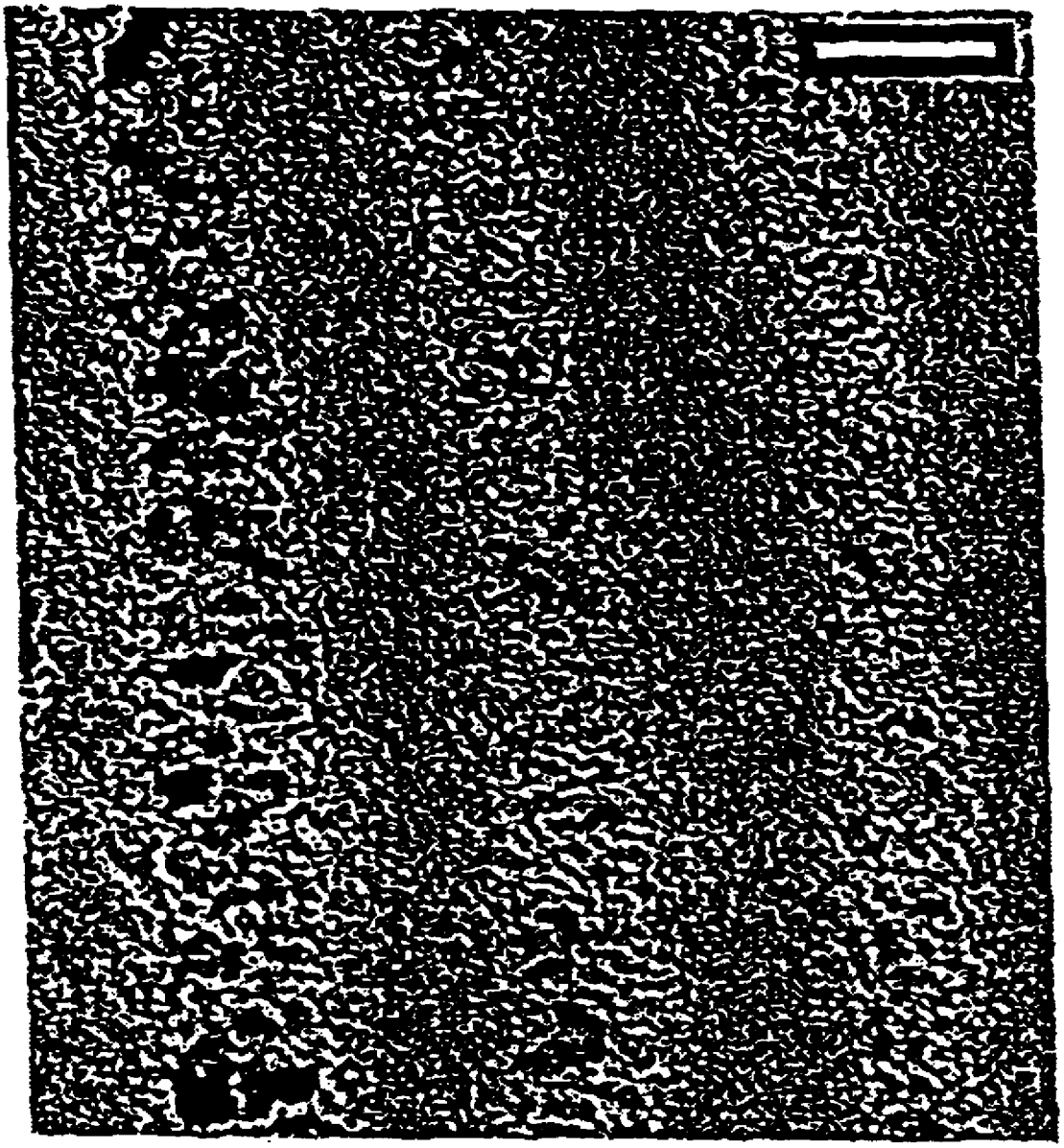
FIG. 14 is a low voltage scanning electron microscope (LVSEM) image of a grating formed within a PDLC blank according to an embodiment of the present invention.

Performing LVSEM on fracture planes parallel to the substrates (fracture parallel to z) of the grating structure formed using H-TPIP, the cross-sectional images clearly indicate the formation of a bulk grating consisting of alternate regions of small LC domains separated by dense polymer FIG. 14. The period for this particular embodiment is approximately 3 microns, consistent with the optical micrographs, and the thickness is approximately 8 microns. The LC regions consist of domains that range in size from 20 nm to several 100's of nm. In this embodiment, 25–30% of the periodicity is composed of the LC-rich regions with the remainder being mostly polymer.

The presence of a well-defined grating structure observed in the SEM images indicates that localized differences in the polymerization rate leads to a certain amount of anisotropic diffusion and phase separation. However, the localized confinement of the LC droplets into well-defined planes is a significant improvement over the poor confinement observed using one-photon holography. In this latter case, droplets were observed throughout the polymer-rich region and the percentage of the Bragg period occupied by the LC-rich region was larger. A much smaller volume of polymer/LC material is initiated by the two-photon process (localized to the high intensity region). As a result, there is a more localized distribution of radicals in the high intensity regions during the initial stages of the polymerization. Comparing this to a one-photon polymerization mechanism where the number of radicals is proportional to the intensity profile, the polymerization rate outside the high intensity regions is lowered. Consequently, the LC molecules have more time to diffuse out of these regions into the low intensity regions before being trapped. Thus, more of the LC is confined to the low intensity region upon phase separation. The ability to skew the LC domain distribution using two-photon holography is an important design option in the fabrication of high performance phase separated structures.

Figure 15:
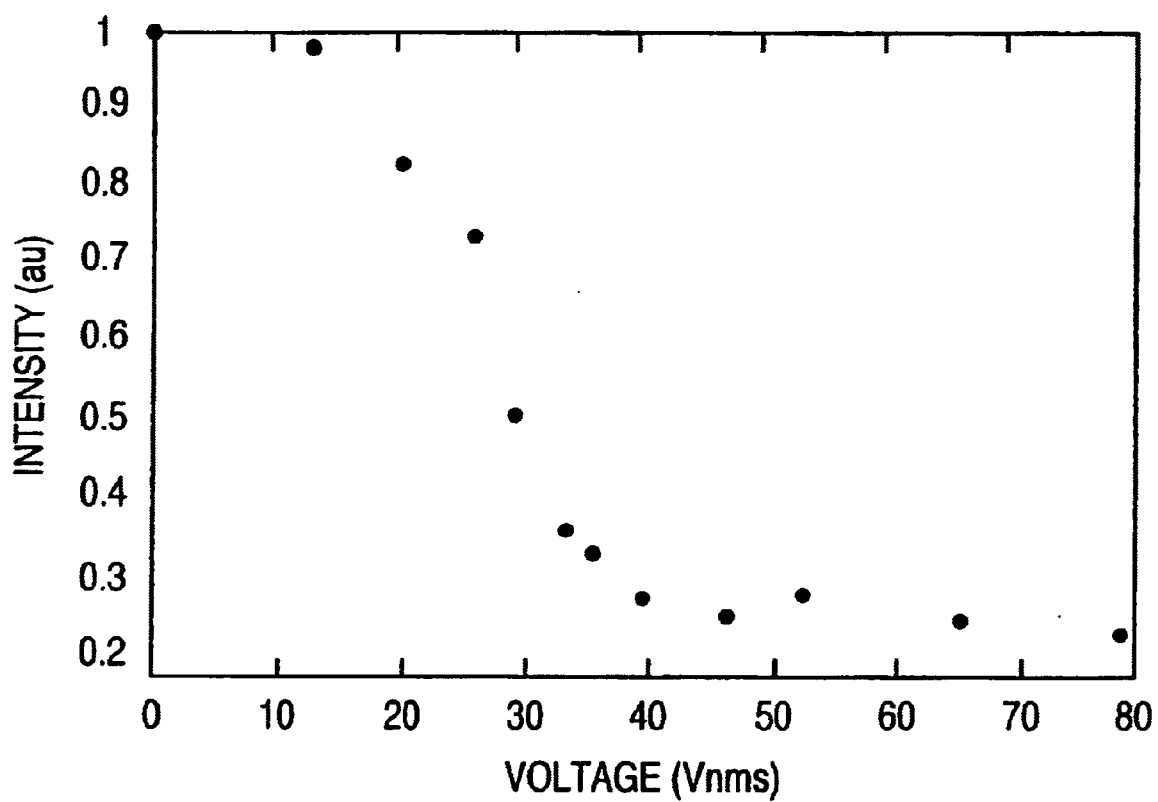
FIG. 15 is the switching curve for a PDLC grating according to an embodiment of the present invention.

The grating structure that is created using the H-TPIP method is a Raman-Nath grating (relative to the He—Ne wavelength) which exhibits several diffracted orders. A clear modulation of the diffracted intensities is observed. A decrease in the second order intensity is accompanied by an increase in the 0th order diffracted intensity. The switching curve is shown in FIG. 15. After $40V_{rms}$, the diffracted intensity of the second order has been minimized. A switching field of 5V/micron is used for the domain sizes. Consequently, a switchable holographic grating may be formed using H-TPIP.

One skilled in the art recognizes that the embodiments illustrated herein are merely exemplary and that the inventive concepts may be practiced in any number of alternate embodiments while remaining within the scope of the present invention.

We claim:

1. A system for forming a switchable hologram comprising:
    a first and a second coherent energy beam; and
    a blank located in the path of the first and second coherent energy beams, wherein the first and second coherent energy beams interfere within the blank to form areas of constructive interference and induce simultaneous areas of photochemical change in parallel within the blank as a result of the simultaneous absorptiorn of two-photons by a chromophore thereby forming a switchable hologram, and further wherein the switchable hologram is switchable between a diffractive state and a non-diffractive state.

2. The system according to claim 1, wherein the blank comprises:
    (a) at least one two-photon absorbing chromophore;
    (b) at least one initiator; and
    (c) at least one reactive matrix.

3. The system according to claim 2, wherein the at least one chromophore includes the at least one initiator.

4. The system according to claim 2, wherein the at least one chromophore is Rose Bengal.

5. The system according to claim 2, wherein the at least one initiator is a photoinitiator.

6. The system according to claim 1, wherein the first and the second coherent energy beams emit energy in the infrared bandwidth.

7. The system according to claim 6, wherein the infrared bandwidth is approximately 700–900 nanometers.

8. The system according to claim 1, wherein the first coherent energy beam and the second coherent energy beam do not have equal energy values.

9. The system according to claim 1, wherein the single coherent energy beam is at least one pulse on the order of femtoseconds in duration.

10. The system according to claim 1, wherein the blank is water-compatible.

11. The system according to claim 1, wherein the resulting induced photochemical change includes a pattern written in the areas of constructive interference.

12. The system according to claim 1, wherein the areas of constructive interference result in a grating pattern.

13. The system according to claim 1, wherein the hologram is a reflection hologram.

14. The system according to claim 1, wherein the hologram is a transmission hologram.

15. The system according to claim 1, wherein the blank comprises at least one two-photon absorbing chromophore and at least one reactive matrix.

16. The system according to claim 15, wherein the at least one two-photon absorbing chromophore is an initiator.

17. A method for forming a hologram, comprising:
    directing a first and a second coherent energy beam at a blank, wherein the blank includes at least one liquid crystal material;
    interfering the first and the second coherent energy beams within the blank;
    creating regions of constructive interference within the blank as a result of interfering the first and second coherent energy beams;
    inducing simultaneous absorption of two photons within the blank; and
    initiating simultaneous areas of photochemical change in parallel within the blank as a result of inducing the simultaneous absorption of two-photons within the blank.

18. The method according to claim 17, wherein the blank comprises:
    (a) at least one two-photon absorbing chromophore;
    (b) at least one initiator; and
    (c) at least one reactive matrix.

19. The method according to claim 17, further comprising passing one of the first and second coherent energy beams through a sample prior to interfering the first and the second coherent energy beams within the blank.

20. The method according to claim 17, wherein the hologram is a reflection hologram.

21. The method according to claim 17, wherein the hologram is a transmission hologram.

22. The method according to claim 17, wherein the hologram is switchable between a diffractive state and non-diffractive state.

23. The method according to claim 17, wherein the blank comprises at least one two-photon absorbing chromophore and at least one reactive matrix.

24. The method according to claim 23, wherein the at least one two-photon absorbing chromophore is an initiator.

25. A system for forming a hologram comprising:
a first and a second coherent energy beam; and
a blank located in the path of the first and second coherent energy beams, wherein the first and second coherent energy beams interfere within the blank to form areas of constructive interference and induce simultaneous areas of photochemical change in parallel within the blank as a result of the simultaneous absorption of two photons, and wherein the blank comprises a reactive monomer and a liquid crystal material.

26. A system for forming a hologram comprising:
a first and a second coherent energy beam;
a blank located in the path of the first and second coherent energy beams, wherein the first and second coherent energy beams interfere within the blank to form areas of constructive interference and induce simultaneous areas of photochemical change in parallel within the blank as a result of the simultaneous absorption of two photons, and
wherein the blank comprises a reactive monomer and a liquid crystal material; and
a sample located within the path of one of the first and second coherent energy beams, wherein the one of the first and second coherent energy beams passes first through the sample and second through the blank.

27. The system according to claim 26, wherein the sample comprises biological material.

28. A system for forming a hologram comprising:
a first and a second coherent energy beam;
a blank located in the path of the first and second coherent energy beams, wherein the first and second coherent energy beams interfere within the blank to form areas of constructive interference and induce simultaneous areas of photochemical change in parallel within the blank as a result of the simultaneous absorption of two photons, and
wherein the blank comprises at least one liquid crystal material.

29. A method for forming a hologram, comprising:
directing a first and a second coherent energy beam at a blank;
interfering the first and the second coherent energy beams within the blank;
creating regions of constructive interference within the blank as a result of interfering the first and second coherent energy beams;
inducing simultaneous absorption of two photons within the blank; and
initiating simultaneous areas of photochemical change in parallel within the blank as a result of inducing the simultaneous two-photon reaction within the blank, wherein the blank comprises reactive monomer and liquid crystal material.

* * * * *